United States Patent
Park et al.

(10) Patent No.: US 8,691,649 B2
(45) Date of Patent: Apr. 8, 2014

(54) METHODS OF FORMING RECESSED CHANNEL ARRAY TRANSISTORS AND METHODS OF MANUFACTURING SEMICONDUCTOR DEVICES

(75) Inventors: Tai-Su Park, Seoul (KR); Jung-Sup Oh, Yongin-si (KR); Gun-Joong Lee, Suwon-si (KR); Jung-Soo An, Suwon-si (KR); Dong-Kyu Lee, Bucheon-si (KR); Jung-Geun Park, Suwon-si (KR); Jeong-Do Ryu, Seoul (KR); Dong-Chan Kim, Anyang-si (KR); Seong-Hoon Jeong, Masan-si (KR); Si-Young Choi, Seongnam-si (KR); Yu-Gyun Shin, Seongnam-si (KR); Jong-Ryeol Yoo, Osan-si (KR); Jong-Hoon Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 13/151,494

(22) Filed: Jun. 2, 2011

(65) Prior Publication Data

US 2011/0237037 A1 Sep. 29, 2011

Related U.S. Application Data

(63) Continuation-in-part of application No. 12/563,473, filed on Sep. 21, 2009.

(30) Foreign Application Priority Data

| Sep. 22, 2008 | (KR) | 10-2008-0092483 |
| May 12, 2009 | (KR) | 10-2009-0041222 |
| Jun. 7, 2010 | (KR) | 10-2010-0053468 |

(51) Int. Cl.
*H01L 21/336* (2006.01)

(52) U.S. Cl.
USPC .............................. 438/268; 438/270

(58) Field of Classification Search
USPC .................................... 438/268, 270
See application file for complete search history.

(56) References Cited

U.S. PATENT DOCUMENTS

| 5,330,935 A * | 7/1994 | Dobuzinsky et al. ......... 438/767 |
| 6,930,062 B2 * | 8/2005 | Hyun et al. .................... 438/790 |
| 2007/0042583 A1 | 2/2007 | Jang et al. |
| 2007/0096204 A1 | 5/2007 | Shiratake |
| 2007/0138545 A1 | 6/2007 | Lin et al. |

(Continued)

FOREIGN PATENT DOCUMENTS

| CN | 1926692 A | 3/2007 |
| CN | 1956170 A | 5/2007 |

(Continued)

OTHER PUBLICATIONS

Chinese Office Action Corresponding to Chinese Patent Application No. 200910253069.4; Date of Issuance: Dec. 27, 2012; 16 Pages (Foreign Text Only).

*Primary Examiner* — Samuel Gebremariam
(74) *Attorney, Agent, or Firm* — Myers Bigel Sibley & Sajovec, PA

(57) ABSTRACT

In methods of manufacturing a recessed channel array transistor, a recess may be formed in an active region of a substrate. A plasma oxidation process may be performed on the substrate to form a preliminary gate oxide layer on an inner surface of the recess and an upper surface of the substrate. Moistures may be absorbed in a surface of the preliminary gate oxide layer to form a gate oxide layer. A gate electrode may be formed on the gate oxide layer to fill up the recess. Source/drain regions may be formed in an upper surface of the substrate at both sides of the gate electrode. Thus, the oxide layer may have a uniform thickness distribution and a dense structure.

20 Claims, 31 Drawing Sheets

(56) References Cited

U.S. PATENT DOCUMENTS

2007/0224836 A1 9/2007 Sasaki et al.
2008/0121990 A1 5/2008 Hasunuma

FOREIGN PATENT DOCUMENTS

| | | |
|---|---|---|
| JP | 11-154749 | 6/1999 |
| JP | 2006-269641 | 10/2006 |
| KR | 1020050065152 A | 6/2005 |
| KR | 100641060 B1 | 10/2006 |
| KR | 1020060121066 A | 11/2006 |
| KR | 1020070016419 A | 2/2007 |
| KR | 1020070066485 A | 6/2007 |
| KR | 1020090045750 A | 5/2009 |

* cited by examiner

METHODS OF FORMING RECESSED CHANNEL ARRAY TRANSISTORS AND METHODS OF MANUFACTURING SEMICONDUCTOR DEVICES

RELATED APPLICATIONS

This application is a Continuation-In-Part of U.S. patent application Ser. No. 12/563,473, entitled "RECESSED CHANNEL ARRAY TRANSISTORS, METHODS OF FORMING RECESSED CHANNEL ARRAY TRANSISTORS, SEMICONDUCTOR DEVICES INCLUDING A RECESSED CHANNEL ARRAY TRANSISTOR, AND METHODS OF MANUFACTURING THE SEMICONDUCTOR DEVICES", filed on Sep. 21, 2009, which claims priority under 35 USC §119 to Korean Patent Application Nos. 10-2008-0092483, filed on Sep. 22, 2008 and 10-2009-0041222, filed on May 12, 2009 in the Korean Intellectual Property Office (KIPO), the contents of which are herein incorporated by reference in their entirety and claims priority under 35 U.S.C. §119 to Korean Patent Application No. 10-2010-0053468, filed on Jun. 7, 2010 in the Korean Intellectual Property Office (KIPO), the disclosure of which is incorporated by herein by reference in its entirety.

BACKGROUND

Example embodiments relate to methods of forming recessed channel array transistors, and methods of manufacturing semiconductor devices.

As semiconductor devices may have been highly integrated, a gate length of a MOS transistor may be gradually decreased. Further, in order to improve an operational speed and a current drive capacity of the semiconductor device, a channel length of the semiconductor device may be reduced to deep sub-micron. Therefore, a short channel effect may be frequently generated in the MOS transistor due to a small size of the semiconductor device. This may cause a malfunction of a gate in the MOS transistor.

In order to solve the above-mentioned problems, recessed channel array transistors have been proposed. The recessed channel array transistors may have a long channel length by forming a recessed portion in a channel region of the MOS transistor. However, in the recessed channel array transistor, a gate insulating layer may be interposed between source/drain regions and a gate electrode. The source/drain regions may have a portion having large area confronting the gate electrode. This may cause a large gate induced leakage current.

Further, an electric field may be concentrated on an edge of the gate electrode. The edge of the gate electrode may function as a parasitic transistor that may cause a double bump where a turn-on may be generated twice.

SUMMARY

Some embodiments of the present invention include methods of manufacturing a recessed channel array transistor. In the methods of manufacturing the recessed channel array transistor, a recess may be formed in an active region of a substrate. A plasma oxidation process may be performed on the substrate to form a preliminary gate oxide layer on an inner surface of the recess and an upper surface of the substrate. Moistures may be absorbed in a surface of the preliminary gate oxide layer to form a gate oxide layer. A gate electrode may be formed on the gate oxide layer to fill up the recess. Source/drain regions may be formed in an upper surface of the substrate at both sides of the gate electrode.

In some embodiments, forming the gate oxide layer may include rinsing the preliminary gate oxide layer using $H_2O$. The rinsing process may be performed at a room temperature to about 90° C. for about several second to about several minutes.

In some embodiments, the plasma oxidation process may be performed from a room temperature to about 900° C.

In some embodiments, absorbing the moistures in the preliminary gate oxide layer may include exposing the preliminary gate oxide layer to atmosphere for about 1 hour to about 10 hours.

In some embodiments, the method may further include thermally oxidizing the preliminary gate oxide layer. The thermal oxidation process may be performed at a temperature of about 800° C. to about 1,100° C.

In some embodiments, the thermal oxidation process may include gradually increasing a temperature in a chamber to an oxidation temperature, introducing an oxygen gas and a hydrogen gas into the chamber at the oxidation temperature, and gradually decreasing the temperature in the chamber.

In some embodiments, the thermal oxidation process may further include introducing the H2O or an oxygen gas and a hydrogen gas into the chamber to absorb the moistures in the preliminary gate oxide layer during decreasing the temperature in the chamber at a temperature of about 100° C. to about 500° C. for several seconds to several minutes. Absorbing the moistures in the preliminary gate oxide layer may be performed during the temperature in the chamber may be gradually decreased or maintained.

In some embodiments, the preliminary gate oxide layer may have a gradually decreasing thickness from an upper side surface of the recess to a lower side surface and a bottom surface of the recess.

In some embodiments, the plasma oxidation process may include controlling a flux of an oxidizing agent in accordance with a depth of the recess to change a thickness of the preliminary gate oxide layer.

In some embodiments, the thermal oxidation process may include selectively increasing a thickness of the preliminary gate oxide layer under the bottom surface of the recess.

In some embodiments, absorbing the moistures in the preliminary gate oxide layer may include bonding a dangling bond in the preliminary gate oxide layer with oxygen to increase a thickness of the preliminary gate oxide layer.

Some embodiments of the present invention include methods of manufacturing a semiconductor device. In the methods of manufacturing the semiconductor device, a first region of a substrate may be etched to form a recess. A plasma oxidation process may be performed on the substrate to form a first preliminary gate oxide layer. Moistures may be absorbed in a surface of the first preliminary gate oxide layer to form a first gate oxide layer. A second gate oxide layer may be formed on a second region of the substrate. A first gate electrode and a second gate electrode may be formed on the first gate oxide layer and the second gate oxide layer, respectively. Impurities may be implanted into an upper surface of the substrate at both sides of the first gate electrode to form first source/drain regions. Impurities may be implanted into an upper surface of the substrate at both sides of the second gate electrode to form second source/drain regions.

In some embodiments, forming the second gate oxide layer may include removing the first gate oxide layer in the second region of the substrate, and oxidizing an upper surface of the second region of the substrate.

In some embodiments, the second gate oxide layer may be formed by a thermal oxidation process.

In some embodiments, the second gate oxide layer may be formed by a plasma oxidation process and a moisture absorption process.

In some embodiments, the second gate oxide layer may have a thickness substantially equal to or less than that of the first gate oxide layer.

In some embodiments, the method may further include thermally oxidizing the first preliminary gate oxide layer.

It is noted that aspects of the invention described with respect to one embodiment, may be incorporated in a different embodiment although not specifically described relative thereto. That is, all embodiments and/or features of any embodiment can be combined in anyway and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION

Figure 1:
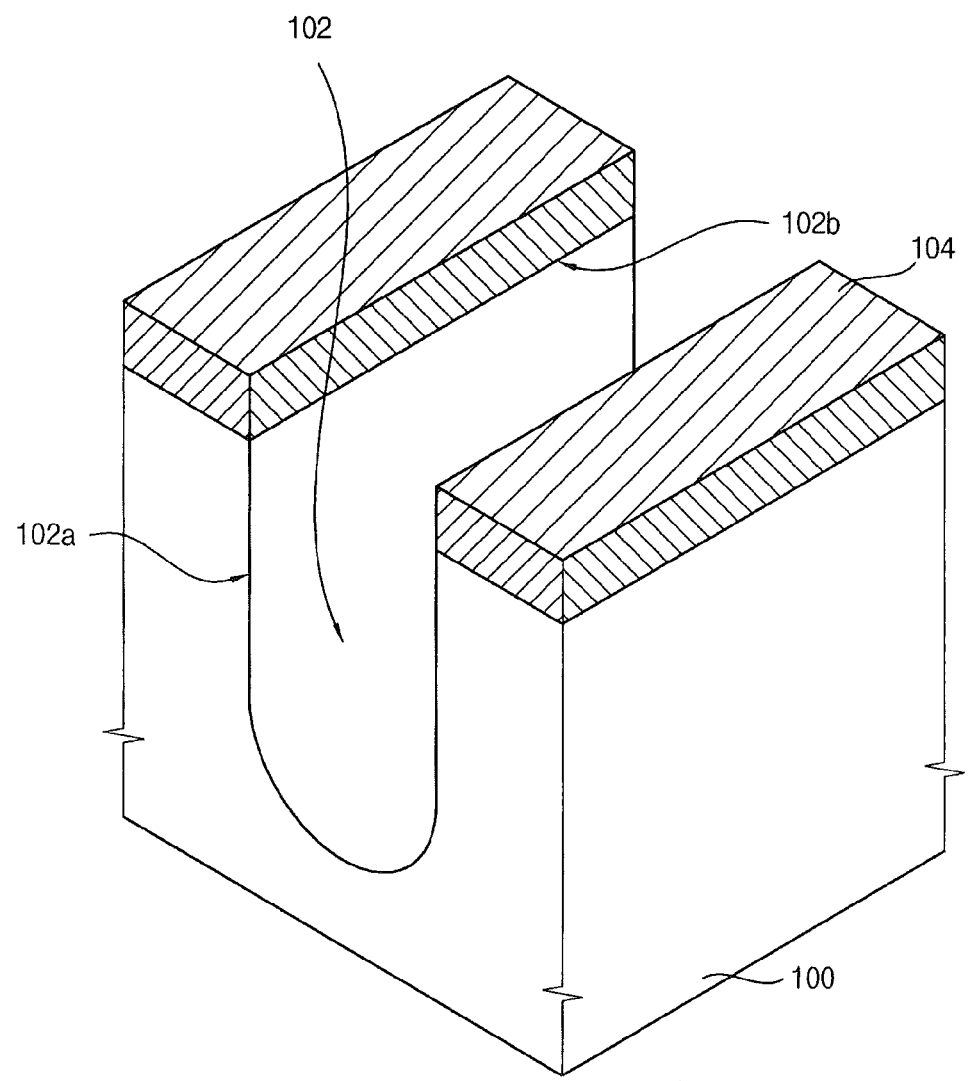
FIGS. 1 to 3 are perspective views illustrating methods of forming an oxide layer in accordance with some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
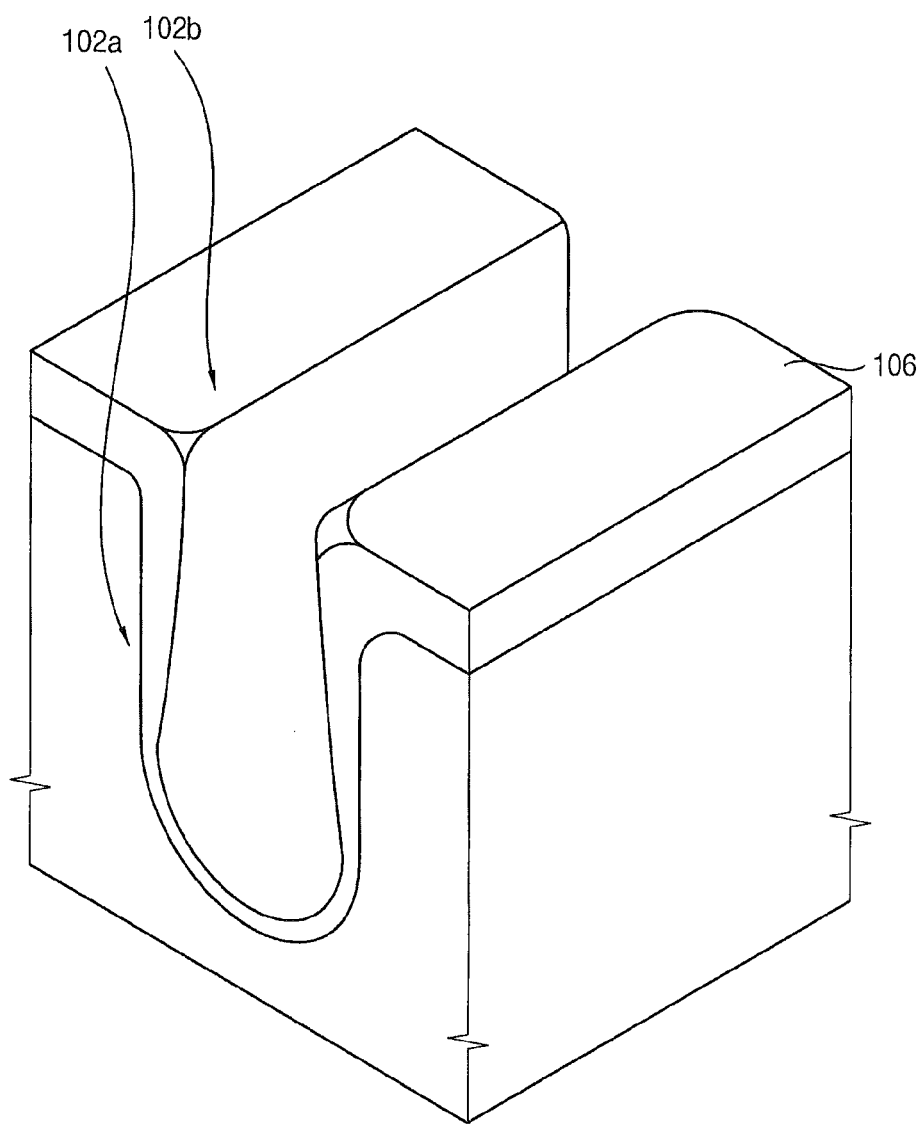
Figure 3:
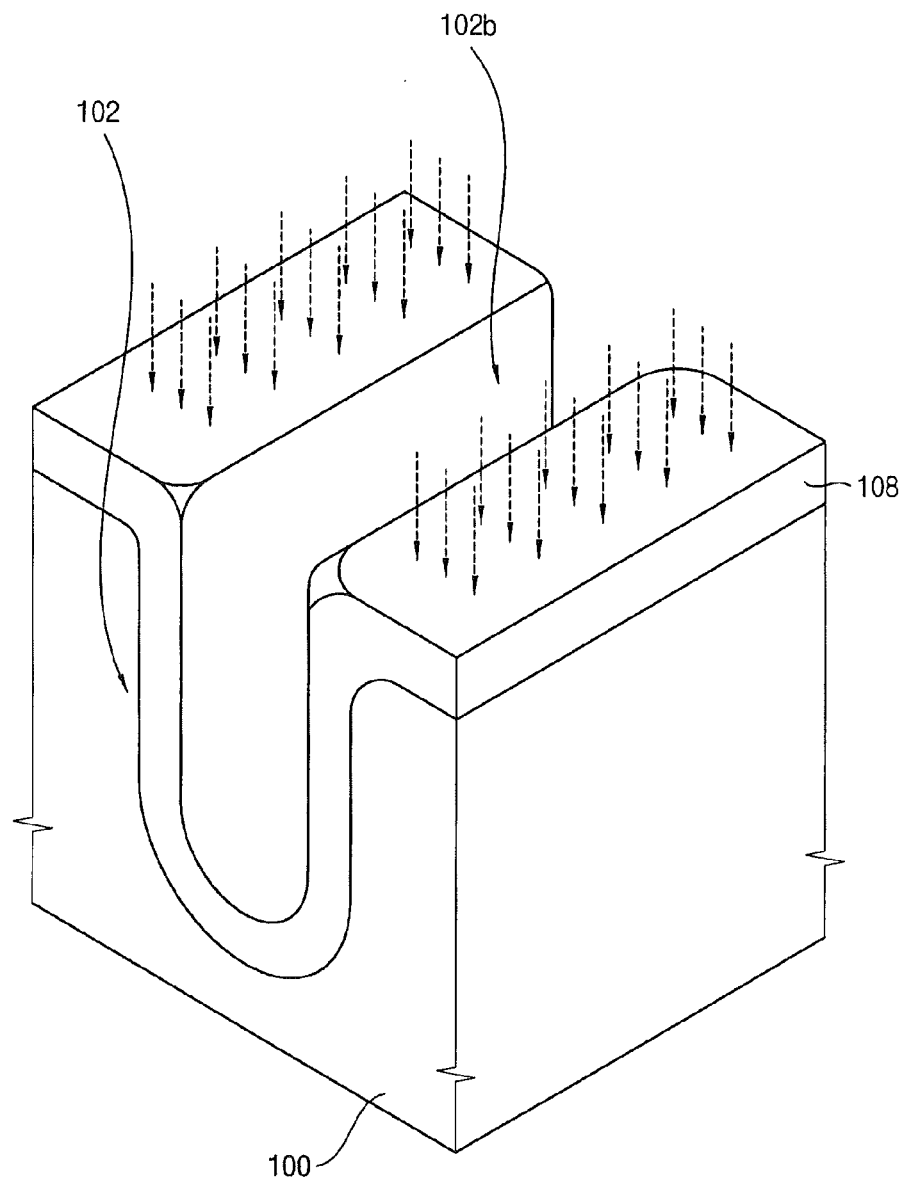

FIGS. 1 to 3 are perspective views illustrating methods of forming an oxide layer in accordance with some embodiments of the present invention.

Referring to FIG. 1, a semiconductor substrate 100 may be partially etched to form a recess 102.

In some embodiments, a mask pattern 104 configured to partially expose a region of the semiconductor substrate where the recess 102 may be formed may be formed on the semiconductor substrate 100. The semiconductor substrate 100 may be anisotropically etched using the mask pattern 104 as an etch mask to form the recess 102. The mask pattern 104 may then be removed.

Here, a portion intersected between a side end of the recess 102 and a side surface of the semiconductor substrate 100 may be referred to as a first corner 102a. A portion intersected between an upper end of the recess 102 and an upper surface of the semiconductor substrate 100 may be referred to as a second corner 102b.

Referring to FIG. 2, some embodiments provide that a preliminary oxide layer 106 may be formed on the upper surface of the semiconductor substrate 100 and an inner surface of the recess 102 by a plasma oxidation process.

In some embodiments, portions of the preliminary oxide layer 106 on the first corner 102a and the second corner 102b formed by the plasma oxidation process may have a thickness substantially the same as or greater than that of a portion of the preliminary oxide layer 106 on a bottom surface of the recess 102.

The thickness profile of the preliminary oxide layer 106 may be caused by concentrating plasma ions on the first corner 102a and the second corner 102b and increasing an influx of an oxidizing agent. Further, the portion of the preliminary oxide layer 106 on the second corner 102b may have a rounded shape. Thus, some embodiments provide that a sharp end may not be generated at an intersection portion of the preliminary oxide layer 106 between the first corner 102a and the second corner 102b.

The thickness of the preliminary oxide layer 106 on the first corner 102a may be greater than about 70% of that of the preliminary oxide layer 106 on the side surface of the recess 102. That is, a thickness difference between the portion of the preliminary oxide layer 106 on the first corner 102a and the portion of the preliminary oxide layer 106 on the side surface of the recess 102 may not be large. In some embodiments, the thickness of the preliminary oxide layer 106 on the first corner 102a may be greater than that of the preliminary oxide layer 106 on the side surface of the recess 102.

In contrast, according to a conventional method of forming an oxide layer by a thermal oxidation process, an oxidation reaction at the first corner 102a and the second corner 102b may become diminished due to stresses on the first corner 102a and the second corner 102b. Particularly, the oxidation reaction at the first corner 102a may become more diminished, so that a thickness difference between the portion of the preliminary oxide layer 106 on the first corner 102a and the portion of the preliminary oxide layer 106 on the side surface of the recess 102 may be very large. That is, the portion of the preliminary oxide layer 106 on the first corner 102a, which may be formed by the thermal oxidation process, may have a very thin thickness. Further, the oxidation reaction may almost not be generated at the first corner 102a, so that a sharp end may be generated at the first corner 102a. Because an electric field may be concentrated on the sharp end in an edge of an active region, a leakage current may be increased due to the sharp end. However, according to some embodiments, the sharp end may not be generated or a sharpness of the sharp end may be smoothed. Therefore, a leakage current of a recessed channel array transistor may be reduced.

Further, the preliminary oxide layer 106 may have a gradually decreased thickness from a side upper portion of the recess 102 to a side lower portion of the recess 102. This may be caused by a flux difference of the oxidizing agent in the recess 102 during the plasma oxidation process. Particularly, the flux of the oxidizing agent in an upper space of the recess 102 may be higher than that in a lower space of the recess 102.

In some embodiments, the preliminary oxide layer 106 may be formed at a temperature of about room temperature to about 900° C., preferably about 650° C. to about 800° C.

After forming the preliminary oxide layer 106 by the thermal oxidation process, the preliminary oxide layer 106 may be thermally treated to densify a structure of the preliminary oxide layer 106.

In some embodiments, the thermal treatment process may provide the preliminary oxide layer 106 with an additional thickness. Particularly, the thickness of a portion of the preliminary oxide layer 106 on the bottom surface of the recess 102 may be greater than that of a portion of the preliminary oxide layer 106 on the upper surfaces of the recess 102 and the semiconductor substrate 100. Thus, an oxidizing agent may be introduced into portions of the preliminary oxide layer 106 on the bottom surface of the recess 102 having a thin thickness or a coarse structure, so that the preliminary oxide layer 106 on the bottom surface of the recess 102 may be cured. In order to effectively perform the curing process, the curing process may be performed at a temperature higher than that of the plasma oxidation process. For example, the thermal treatment process may be performed at a temperature of about 800° C. to about 1,100° C. under oxygen atmosphere. Further, the portion of the preliminary oxide layer 106 on the bottom surface of the recess 102 may have an increased thickness greater than that of the portion of the preliminary oxide layer 106 on the upper surface of the semiconductor substrate 100.

In some embodiments, the structure of the preliminary oxide layer 106 may be densified by a following rinsing process. Therefore, the thermal treatment process may be omitted.

Referring to FIG. 3, the preliminary oxide layer 106 may be rinsed using $H_2O$. In some embodiments, the rinsing process may include a wet rinsing process, a quick dry rinsing process. The rinsing process may bond dangling bonds in a surface of the preliminary oxide layer 106 with oxygen, so that the preliminary oxide layer 106 may be cured to form an oxide layer 108. The oxide layer 108 may have decreased dangling bonds compared to the preliminary oxide layer 106. The oxide layer 108 may have a thickness greater than that of the preliminary oxide layer 106.

In some embodiments, a plurality of the dangling bonds may be in the surface of the preliminary oxide layer 106 before the rinsing process. The dangling bonds may be bonded with hydrogen in a standby time before performing a following process, so that the thickness of the preliminary oxide layer 106 may be increased. Particularly, the thickness of the preliminary oxide layer 106 may be continuously increased in proportion to the standby time. The thickness of the preliminary oxide layer 106 may not be increased after the standby time of about 10 hours. Thus, the preliminary oxide layer 106 may have a high thickness distribution in accordance with the standby time. The high thickness distribution of the preliminary oxide layer 106 may cause characteristic differences between elements of a semiconductor device.

However, according to some embodiments, the rinsing process using the $H_2O$ may provide the oxide layer 108 with the thickness greater than that of the preliminary oxide layer 106. Further, although the oxide layer 108 may be on standby for a long time, the thickness of the oxide layer 108 may not be increased, because the dangling bonds of the oxide layer 108 may be removed by the rinsing process using the $H_2O$. As a result, the oxide layer 108 may have a low thickness distribution, so that the semiconductor device may have uniform characteristics.

Further, because the preliminary oxide layer 106 may be formed at a temperature lower than that of a thermal oxidation process, the preliminary oxide layer 106 may have a coarse structure. Therefore, the preliminary oxide layer 106 may have a bad etching resistivity, so that the preliminary oxide layer 106 may be rapidly etched and a deviation of etched amounts of the preliminary oxide layer 106 may be very high. In contrast, the oxide layer 108 formed by the rinsing process using the $H_2O$ may have a structure denser than that of the preliminary oxide layer 106. Thus, the oxide layer 108 may be slowly etched compared to the preliminary oxide layer 106 and etched amounts of the oxide layer 108 may have a low deviation.

Figure 4:
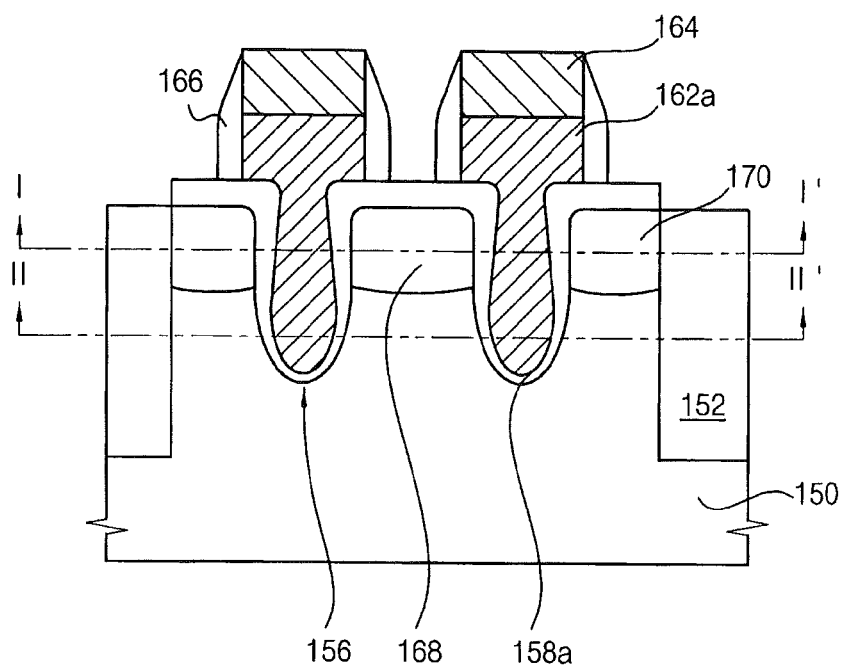
FIG. 4 is a cross-sectional view illustrating a recessed channel array transistor including the oxide layer in FIG. 1.
Figure 5:
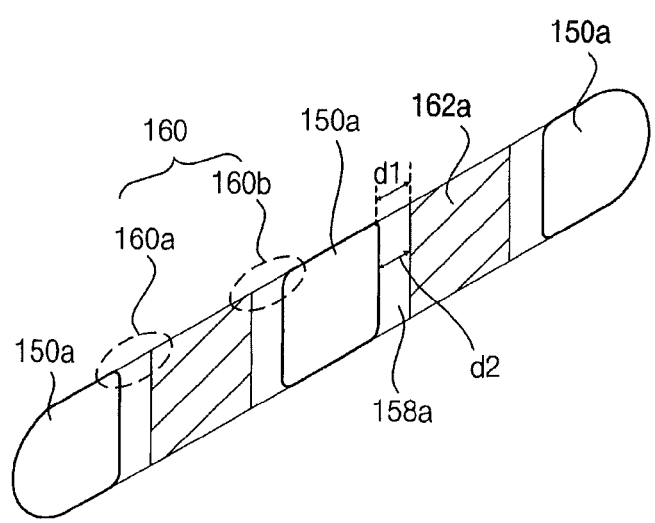
FIG. 5 is a cross-sectional view taken along a line I-I' in FIG. 4.
Figure 6:
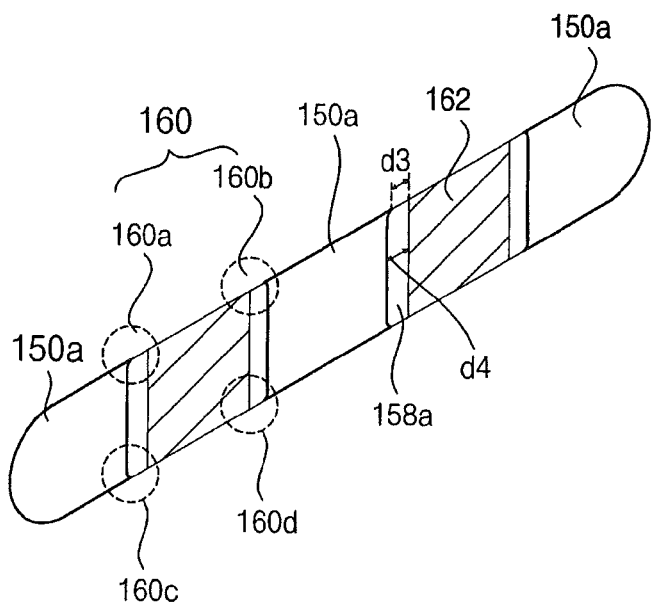
FIG. 6 is a cross-sectional view taken along a line II-II' in FIG. 4.

FIG. 4 is a cross-sectional view illustrating a recessed channel array transistor including the insulating layer in FIG. 1. FIG. 5 is a cross-sectional view taken along a line I-I' in FIG. 4, and FIG. 6 is a cross-sectional view taken along a line II-II' in FIG. 4. As illustrated, the transistor in FIG. 4 may include the oxide layer in FIG. 3.

Referring to FIGS. 4 to 6, a semiconductor substrate 150 may be prepared. In some embodiments, the semiconductor substrate 150 may include single crystalline silicon. An isolation layer pattern 152 may be formed in the semiconductor substrate 150. The isolation layer pattern 152 may define an active region 150a and an isolation region of the semiconductor substrate 150. The active region 150a may have an isolated island shape. The isolation layer pattern 152 may be configured to surround the active region 150a. The isolation layer pattern 152 may be formed by a shallow trench isolation process.

Some embodiments provide that a recess 156 may be formed at an upper surface of the semiconductor substrate 150 in the active region 150a. In some embodiments, the recess 156 may have a shape crossing over the active region 150a. Thus, the recess 156 may have a first side surface, a second side surface, a third side surface and/or a fourth side surface. The first side surface may confront the second side surface. The third side surface may confront the fourth side surface. Therefore, the first side surface and the second side surface may be substantially perpendicular to the third side surface and the fourth side surface. The semiconductor substrate 150 may be exposed through the first side surface and the second side surface. Further, the isolation layer pattern 152 may be exposed through the third side surface and the fourth side surface. The recess 156 may have a gradually decreased width along a downward direction.

The recess 156 may have a first corner 160 and a second corner (not shown). The first corner 160 may correspond to an intersection between a side edge of the recess 156, a sidewall of the active region 150a and the isolation layer pattern 152. The second corner may correspond to an intersection between an upper end of the recess 156 and an upper surface of the semiconductor substrate 150.

In some embodiments, an extending direction of the active region 150a may be substantially perpendicular to that of the recess 156. In contrast; as shown in FIGS. 4 and 5, some embodiments provide that the extending direction of the active region 150a may be inclined to the extending direction of the recess 156.

Referring to FIG. 5, the first corner 160 may have first upper corners 160a and 160b where a side upper portion of the recess 156 and the sidewall of the active region 150a may be intersected with each other. The first upper corners 160a and 160b may have a rounded shape.

Because the first upper corners 160a and 160b may have the rounded shape without a sharp portion, an electric field may not be concentrated on the first upper corners 160a and 160b. Particularly, when the recess 156 may be inclined to the active region 150a, the electric field concentration on the first upper corners 160a and 160b may be more reduced.

In contrast, referring to FIG. 6, the first corner may also have first lower corners 160c and 160d where a side lower portion of the recess 156 and the sidewall of the active region 150a may be intersected with each other. Although the first lower corners 160c and 160d may have a sharper shape than the first upper corners 160a and 160b, the first lower corners 160c and 160d in the recessed channel array transistor of some embodiments may have sharpness that is relatively less than that of first lower corners in conventional recessed channel array transistors.

As described herein, recessed channel array transistors including cross-sectional views as illustrated in FIGS. 5 and 6 may be obtained by lapping an upper surface of the recessed channel array transistor and observing an upper surface of the lapped recessed channel array transistor using an SEM or a TEM.

Referring to FIGS. 4 to 6, a gate oxide layer 158a may be formed on the upper surface of the semiconductor substrate 150 and an inner surface of the recess 156. In some embodiments, the gate oxide layer 158a may be formed by the plasma oxidation process and the rinsing process using the H2O. The gate oxide layer 158a may have a dense structure, a good etching resistivity, and a good electrical stress resistivity.

In some embodiments, the gate oxide layer 158a may have a first portion on the first upper corners 160a and 160b, and a second portion on the side surface of the recess 156. The first portion may have a thickness d1 and d3 greater than about 70% of a thickness d2 and d4 of the second portion. Particularly, the thickness of the first portion may be about 70% to about 130% of the thickness of the second portion.

Referring to FIG. 5, the thickness d1 of the first portion of the gate oxide layer 158a on the first upper corners 160a and 160b may be substantially the same as or greater than the thickness d2 of the second portion of the gate oxide layer 158a on the side surface of the recess 156.

In some embodiments, the thickness d1 of the first portion of the gate oxide layer 158a on the first upper corners 160a and 160b may be about 70% to about 130% of the thickness d2 of the second portion of the gate oxide layer 158a on the side surface of the recess 156.

Referring to FIG. 6, the gate oxide layer 158a may further have a third portion on the first lower corners 160c and 160d and a fourth portion on the side surface of the recess 156. A thickness d3 of the first portion of the gate oxide layer 158a on the first lower corners 160c and 160d may be about 70% to about 130% of the thickness d4 of the fourth portion of the gate oxide layer 158a on the side surface of the recess 156.

Here, the lower space and the upper space of the recess 156 may be divided by a horizontal plane on a half height of the recess 156 measured from a bottom surface of the recess 156.

That is, as shown in FIGS. 5 and 6, the first portion of the gate oxide layer 158a on the first upper corners 160a and 160b may have the thickness greater than about 70% of the thickness of the second portion of the gate oxide layer 158a on the side surface of the recess 156.

Further, the first portion of the gate oxide layer 158a on the first upper corners 160a and the 160b may have a gradually decreased thickness along the downward direction. Particularly, a thickness difference between the first portion on the first upper corners 160a and 160b and the second portion on the side surface of the recess 156 may become larger along the downward direction.

However, in the recessed channel array transistor of some embodiments, the thickness of the first portion on the first upper corners 160a and 160b may be greater than about 70% of the thickness of the second portion on the side surface of the recess 156. That is, the thickness difference between the first portion on the first upper corners 160a and 160b and the second portion on the side surface of the recess 156 may be within about 30% of the thickness of the second portion.

Therefore, the first portion of the gate oxide layer 158a on the first upper corners 160a and 160b may not have a very thin thickness, so that the electric field may not be concentrated on the first upper corners 160a and 160b. As a result, malfunctions of the recessed channel array transistor of embodiments described herein may be reduced.

Further, the gate oxide layer 158a on the side upper surface of the recess 156 may have a thickness greater than that of the gate oxide layer on the side lower surface of the recess 156. In some embodiments, the gate oxide layer 158a may have the gradually decreased thickness along the downward direction.

A gate electrode 162a may be formed on the gate oxide layer 158a in the recess 156. In some embodiments, the gate electrode 162a may have a protrusion protruded from the upper surface of the semiconductor substrate 150. A hard mask pattern 164 may be formed on the gate electrode 162a.

Spacers 166 may be formed on a sidewall of the protrusion of the gate electrode 162a. Source/drain regions 168 and 170 may be formed in the semiconductor substrate 150 at both sides of the gate electrode 162a.

According to some embodiments, the gate oxide layer 158a may have the gradually decreased thickness from the side upper surface of the recess 156 to the side lower surface of the recess 156. Thus, the thickness of the gate oxide layer 158a between the source/drain regions 168 and 170 and the gate electrode 162a may be greater than that of the gate oxide layer 158a on a channel region of the recessed channel array transistor. Therefore, a gate induced drain leakage current may be remarkably reduced, so that the recessed channel array transistor may have improved operational characteristics. Moreover, the gate oxide layer 158a on the channel region may have a relatively thin thickness, so that the recessed channel array transistor may have a rapid on-current. As a result, the recessed channel array transistor may have a rapid operational speed.

FIGS. 7 to 12 are cross-sectional views and perspective views illustrating methods of forming the recessed channel array transistor in FIG. 4.

Figure 7:
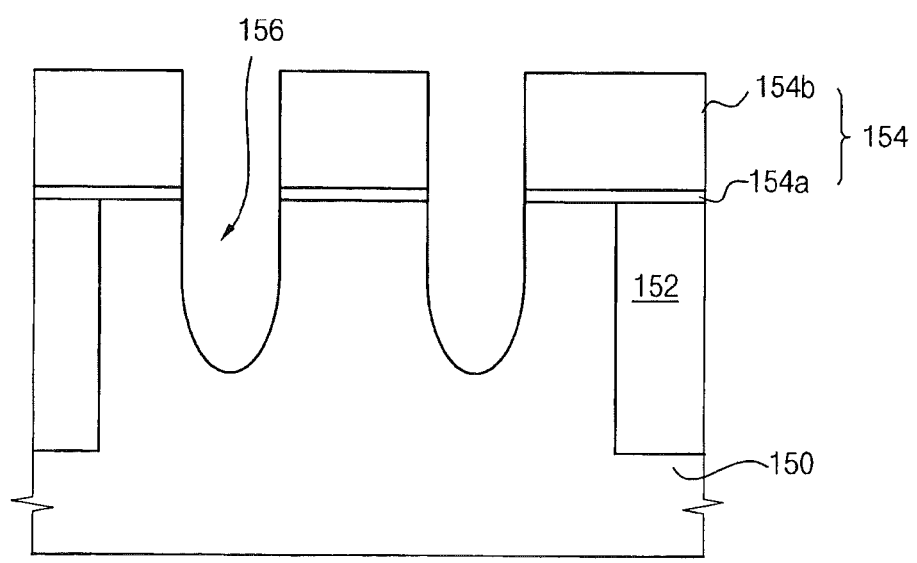
FIGS. 7 to 12 are cross-sectional views and perspective views illustrating methods of forming the recessed channel array transistor in FIG. 4.

Referring to FIG. 7, a shallow trench isolation process may be performed on a semiconductor substrate 150 to form an isolation layer pattern 152, thereby defining an active region 150a and an isolation region of the semiconductor substrate 150. In some embodiments, the active region 150a may have an isolated island shape. The isolation layer pattern 152 may be configured to surround the active region 150a.

A mask pattern 154 configured to expose a region of the semiconductor substrate 150 where a recess may be formed may be formed on the active region 150a of the semiconductor substrate 150 and the isolation layer pattern 152. In some embodiments, the mask pattern 154 may include a pad oxide layer pattern 154a and a silicon nitride layer pattern 154b formed on the pad oxide layer pattern 154a. The exposed region of the semiconductor substrate 150 through the mask pattern 154 may have a linear shape crossing over the active region 150a.

The active region 150a of the semiconductor substrate 150 may be anisotropically etched using the mask pattern 154 as an etch mask to form the recess 156. In some embodiments, the recess 156 may be formed by a reactive ion etching process using an etching gas that may include chlorine (Cl). After forming the recess 156, a cleaning process may be additionally performed to remove byproducts generated in the reactive ion etching process.

In some embodiments, the recess 156 may have both side surfaces arranged in a direction substantially perpendicular to an extending direction of a channel. The isolation layer pattern 152 may be exposed through the side surfaces of the recess 156. That is, the recess 156 may be arranged in the direction substantially perpendicular to the extending direction of the channel.

Although not depicted in drawings, after forming the recess 156, the mask pattern 154 may then be removed.

Figure 8:
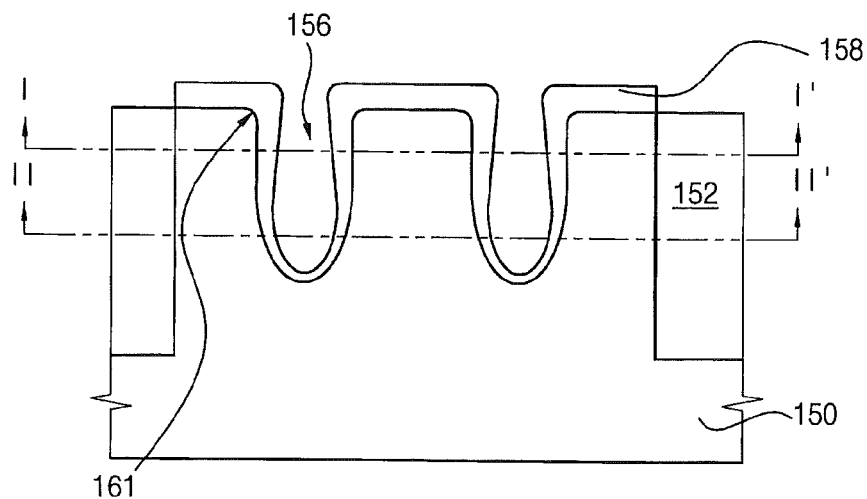

Referring to FIG. 8, a plasma oxidation process may be performed on an upper surface of the semiconductor substrate 150 and an inner surface of the recess 156 to form a preliminary gate oxide layer 158.

In some embodiments, the plasma oxidation process may use an oxidizing agent including $O_2$, NO, and/or $N_2O$, among others. These may be used alone or in a combination thereof. Further, the plasma oxidation process may use a source gas for generating plasma including argon, helium, and/or xenon, among others. These may be used alone or in a combination thereof.

In some embodiments, the oxidizing agent used in the plasma oxidation process may be electrically neutral and/or may be an electrical ion.

In some embodiments, the plasma oxidation process may allow an oxidation reaction at a temperature relatively lower than that of a thermal oxidation process. For example, the plasma oxidation process may oxidize silicon at a temperature of a normal temperature to about 900° C., and/or about 650° C. to about 800° C.

In some embodiments, the plasma oxidation process may be performed under a pressure of about 0.01 Torr to about 50 Torr, and/or about 0.5 Torr to about 5 Torr. The pressure may control an influx of the oxidizing agent introduced into the recess 156. Particularly, the influx of the oxidizing agent introduced into a lower space of the recess 156 may be reduced in proportional to the pressure drop in the plasma oxidation process.

In some embodiments, the influx of the oxidizing agent in accordance with a depth of the recess 156 may be controlled by applying a bias during the plasma oxidation process. When the bias may be applied, the influx of the oxidizing agent introduced into the lower space of the recess 156 may be increased.

In some embodiments, corners of the recess 156 may have a rounded shape by the oxidation reaction.

Further, the preliminary gate oxide layer 158 may have a variable thickness by positions. The first portion of the preliminary gate oxide layer 158 on the first upper corners 160a and 160b may have the thickness d1 greater than about 70% of the thickness d3 of the second portion of the preliminary gate oxide layer 158 on the side surface of the recess 156.

Figure 9:
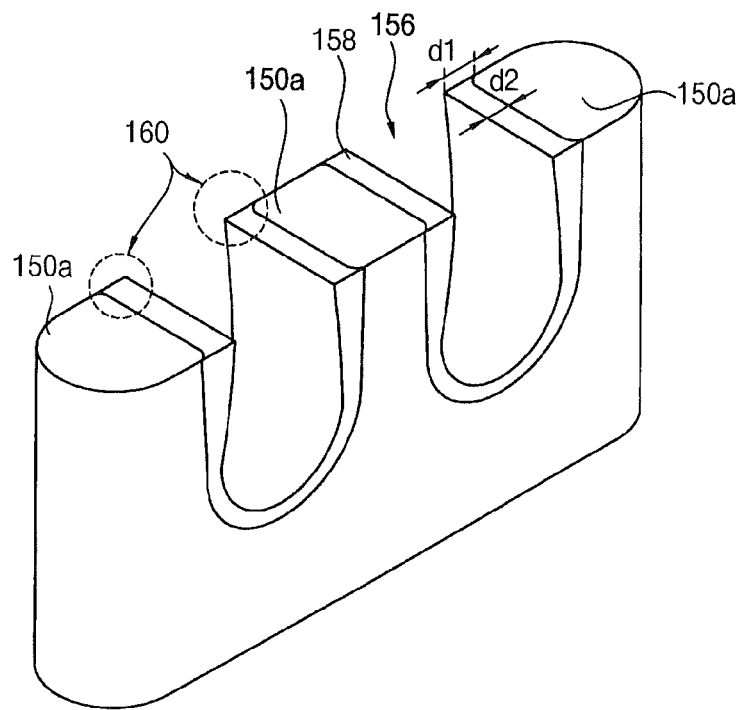

Referring to FIG. 9, the preliminary gate oxide layer 158 may have a first portion on first upper corners, and a second portion on the side surface of the recess 156. The first portion may have a thickness d1 greater than about 70% of a thickness d2 of the second portion. Particularly, the thickness d1 of the first portion of the preliminary gate oxide layer 158 on the first upper corners may be greater than the thickness d2 of the second portion of the preliminary gate oxide layer 158 on the side surface of the recess 156.

Figure 10:
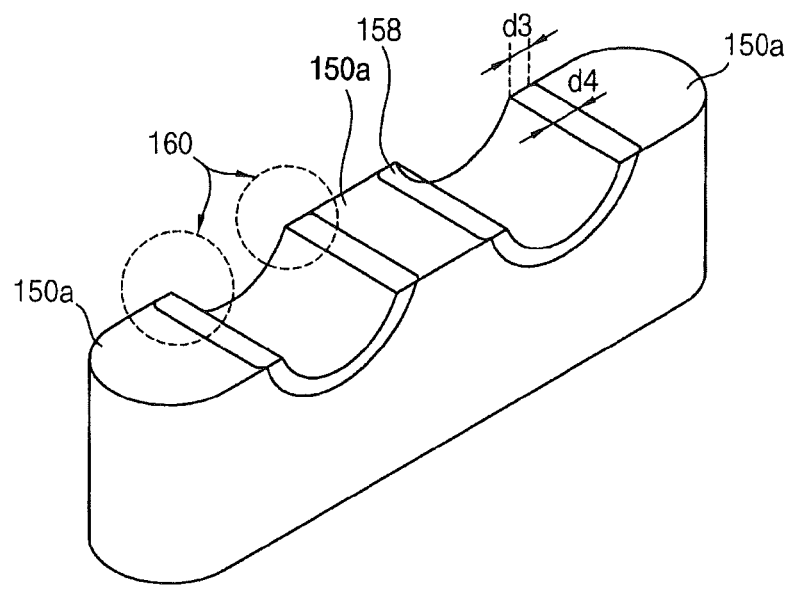

Referring to FIG. 10, the preliminary gate oxide layer 158 may further have a third portion on the first lower corners and a fourth portion on the side surface of the recess 156. A thickness d3 of the first portion of the preliminary gate oxide layer 158 on the first lower corners may be greater than about 70% of the thickness d4 of the fourth portion of the preliminary gate oxide layer 158 on the side surface of the recess 156.

That is, as shown in FIGS. 9 and 10, the thickness of the preliminary gate oxide layer 158 on the edge of the recess 156 may be greater than about 70% of the thickness of the preliminary gate oxide layer 158 on the central portion of the recess 156.

That is, the thickness difference between the first portion on the first upper corners and the second portion on the side surface of the recess 156 may be within about 30% of the thickness of the second portion regardless of horizontal measuring points. Particularly, the thickness difference between the first portion and the second portion of the preliminary gate oxide layer 158 in the lower space of the recess 156 may become large. In contrast, according to some embodiments, as mentioned above, the thickness difference between the first portion on the first upper corners and the second portion on the side surface of the recess 156 may be within about 30% of the thickness of the second portion. Thus, a portion of the preliminary gate oxide layer 158 on the first corner 160 may have low sharpness.

In some embodiments, the preliminary gate oxide layer 158 may have a gradually decreased thickness along the downward direction. As mentioned above, the influx of the oxidizing agent introduced into the recess 156 may be controlled in accordance with the pressure and the bias. Therefore, the preliminary gate oxide layer 158 may be provided with a large thickness difference or a small thickness difference by the depth of the recess 156 by changing the pressure and the bias in the plasma oxidation process. For example, the preliminary gate oxide layer 158 may be provided with the large thickness difference by the depth of the recess 156 by lowering the pressure or decreasing the bias.

Although not depicted in drawings, after forming the preliminary gate oxide layer 158 by the plasma oxidation process, a thermal treatment process may be additionally performed to provide the preliminary gate oxide layer 158 with a dense structure. That is, the thermal treatment process may facilitate an oxidation reaction at a coarse portion of the preliminary gate oxide layer 158. Thus, the relatively thin preliminary gate oxide layer 158 on the bottom surface of the recess 156 may have improved characteristics. Further, the thermal treatment process may provide the preliminary gate oxide layer 158 with an increased thickness. Particularly, the portion of the preliminary gate oxide layer 158 on the bottom surface of the recess 156 may have an increased thickness.

In some embodiments, the thermal treatment process may be performed at a temperature greater than that of the plasma oxidation process. For example, the thermal treatment process may be performed at a temperature of about 800° C. to about 950° C. Alternatively, the thermal treatment process may be omitted.

Figure 11:
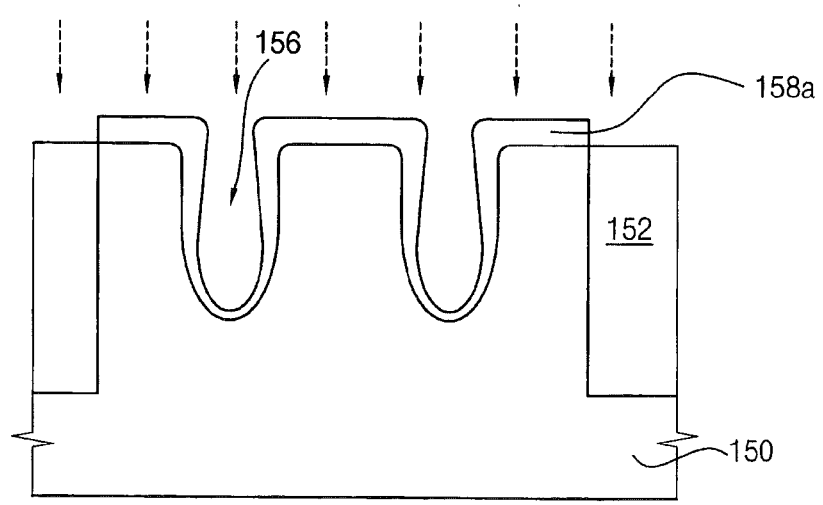

Referring to FIG. 11, the preliminary gate oxide layer 158 may be rinsed using $H_2O$. In some embodiments, the rinsing process may include a wet rinsing process, a quick dry rinsing process, etc. The rinsing process may bond the dangling bonds at the surface of the preliminary gate oxide layer 158 with oxygen, so that the preliminary gate oxide layer 158 may be cured, thereby forming a gate oxide layer 158a having decreased dangling bonds.

In some embodiments, the gate oxide layer 158a may have characteristics substantially the same as those of the preliminary gate oxide layer 158 illustrated with reference to FIGS. 8 to 10. Thus, a thickness of the gate oxide layer 158a may not be increased during a standby time. Further, the gate oxide layer 158a may have a dense structure compared to the preliminary gate oxide layer 158. The gate oxide layer 158a may have a thickness greater than that of the preliminary gate oxide layer 158.

Figure 12:
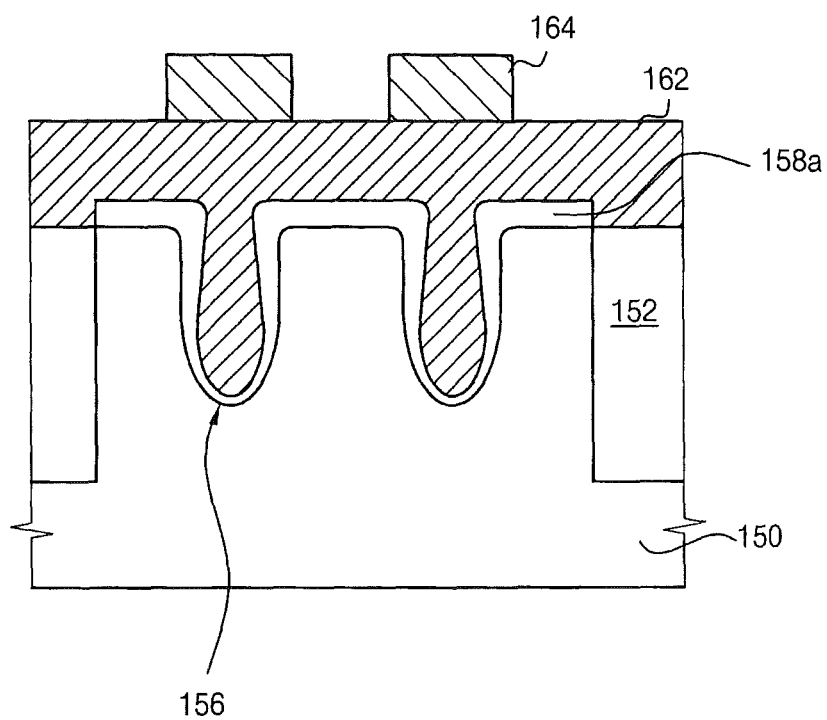

Referring to FIG. 12, a gate conductive layer 162 may be formed on the gate oxide layer 158a and the semiconductor substrate 150. In some embodiments, the gate conductive layer 162 may include, for example, polysilicon having good step coverage. For example, the gate conductive layer 162 may be formed using an $SiH_4$ gas and a $PH_3$ gas at a temperature of about 450° C. to about 550° C. The recess 156 may be filled with the gate conductive layer 162.

A hard mask pattern 164 may be formed on the gate conductive layer 162. The hard mask pattern 164 may be configured to cover the recess 156.

Referring to FIG. 4, the gate conductive layer 162 may be etched using the hard mask pattern 164 as an etch mask to form a gate electrode 162a. A spacer layer (not shown) may be formed on the gate electrode 162a and the semiconductor substrate 150. The spacer layer may be anisotropically etched to form a spacer 166 on a sidewall of the gate electrode 162a. In some embodiments, the process for forming the spacer 166 may be omitted for simplifying the methods described herein.

Some embodiments provide that impurities may be implanted into the semiconductor substrate 150 at both sides of the gate electrode 162a to form source/drain regions 168 and 170.

Figure 13:
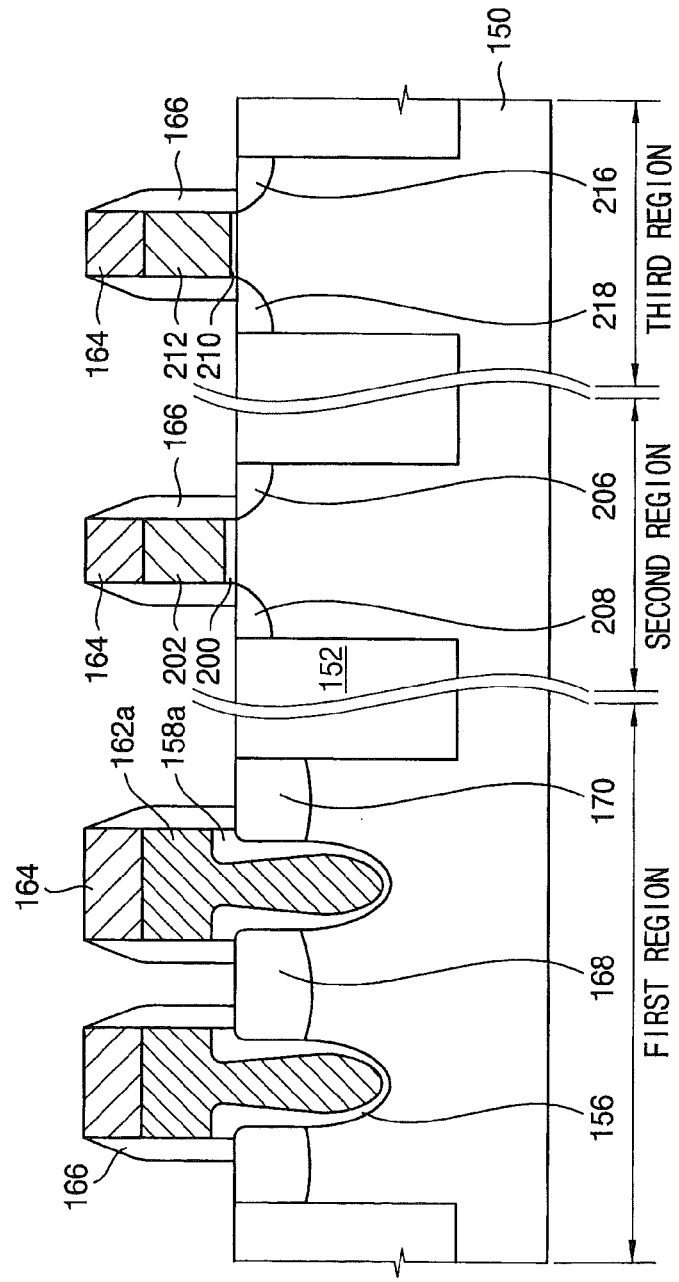
FIG. 13 is a cross-sectional view illustrating a semiconductor device including the recessed channel array transistor in FIG. 4.

FIG. 13 is a cross-sectional view illustrating a semiconductor device including the recessed channel array transistor in FIG. 4. Here, the semiconductor device in FIG. 13 may include a planar transistor.

Referring to FIG. 13, a semiconductor substrate 150 may have a first region, a second region and a third region. In some embodiments, the semiconductor substrate 150 may include single crystalline silicon. The first region may correspond to a memory cell region where memory cells may be formed.

The second region and the third region may correspond to peripheral circuit regions where peripheral circuits may be formed.

A recessed channel array transistor substantially the same as that in FIG. 4 may be formed in the first region of the semiconductor substrate 150. The recessed channel array transistor may include a first gate oxide layer 158a in a recess 156. In some example embodiments, the first gate oxide layer 158a may be formed by the plasma oxidation process and the rinsing process using the H$_2$O. The first gate oxide layer 158a may have a gradually decreased thickness from a side upper surface of the recess 156 to a side lower surface of the recess 156. A first portion of the first gate oxide layer 158a on a first corner where the side surface of the recess 156 and a side surface of the active region, i.e., the first region may be intersected with each other may have a thickness greater than about 70% of the thickness of a second portion of the first gate oxide layer 158a on the side surface of the recess 156.

A first planar transistor and a second planar transistor may be formed in the second region and the third region of the semiconductor substrate 150, respectively. In some example embodiments, the first planar transistor and the second planar transistor may correspond to peripheral circuits. For example, the first planar transistor may correspond to a high-voltage transistor. The second planar transistor may correspond to a low-voltage transistor.

The first planar transistor may include a second gate oxide layer 200. In some embodiments, the second gate oxide layer 200 may be formed by a plasma oxidation process and a rinsing process using H$_2$O. Alternatively, the second gate oxide layer 200 may be formed by a thermal oxidation process. The second gate oxide layer 200 may have a thickness less than that of the first gate oxide layer 158a. A second gate electrode 202 and a hard mask pattern 164 may be sequentially formed on the second gate oxide layer 200. A spacer 166 may be formed on a sidewall of the second gate electrode 202. Second source/drain regions 206 and 208 may be formed in an upper surface of the semiconductor substrate 150 at both sides of the second gate electrode 202.

The second planar transistor may include a third gate oxide layer 210. In some embodiments, the second third oxide layer 210 may be formed by a thermal oxidation process. The third gate oxide layer 210 may have a thickness less than that of the second gate oxide layer 200. A third gate electrode 212 and the hard mask pattern 164 may be sequentially formed on the third gate oxide layer 210. The spacer 166 may be formed on a sidewall of the third gate electrode 212. Second source/drain regions 216 and 218 may be formed in an upper surface of the semiconductor substrate 150 at both sides of the third gate electrode 212.

FIGS. 14 to 18 are cross-sectional views illustrating methods of manufacturing the semiconductor device in FIG. 13.

Figure 14:
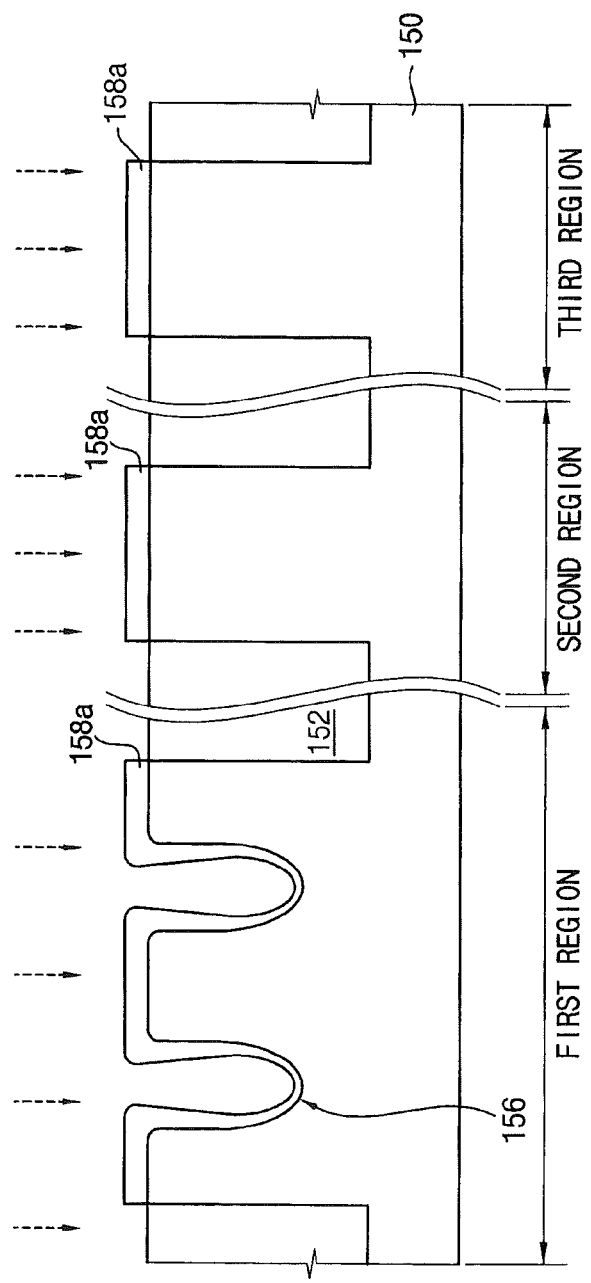
FIGS. 14 to 18 are cross-sectional views illustrating methods of manufacturing the semiconductor device in FIG. 13.

Referring to FIG. 14, a shallow trench isolation process may be performed on a semiconductor substrate 150 having a first region, a second region and a third region to form an isolation layer pattern 152, thereby defining an active region and an isolation region of the semiconductor substrate 150. In some embodiments, the active region in the first region may have an isolated island shape. The isolation layer pattern 152 may be configured to surround the active region.

The active region in the first region may be partially etched to form a recess 156. Here, the process for forming the recess 156 may be substantially the same as that described above and illustrated with reference to FIG. 7.

A first preliminary gate oxide layer (not shown) may be formed on the recess 156 and the semiconductor substrate 150 by a plasma oxidation process. The first preliminary gate oxide layer may be rinsed using H$_2$O to form a first gate oxide layer 158a. Here, the process for forming the first gate oxide layer 158a may be substantially the same as that illustrated with reference to FIGS. 8 to 11.

Figure 15:
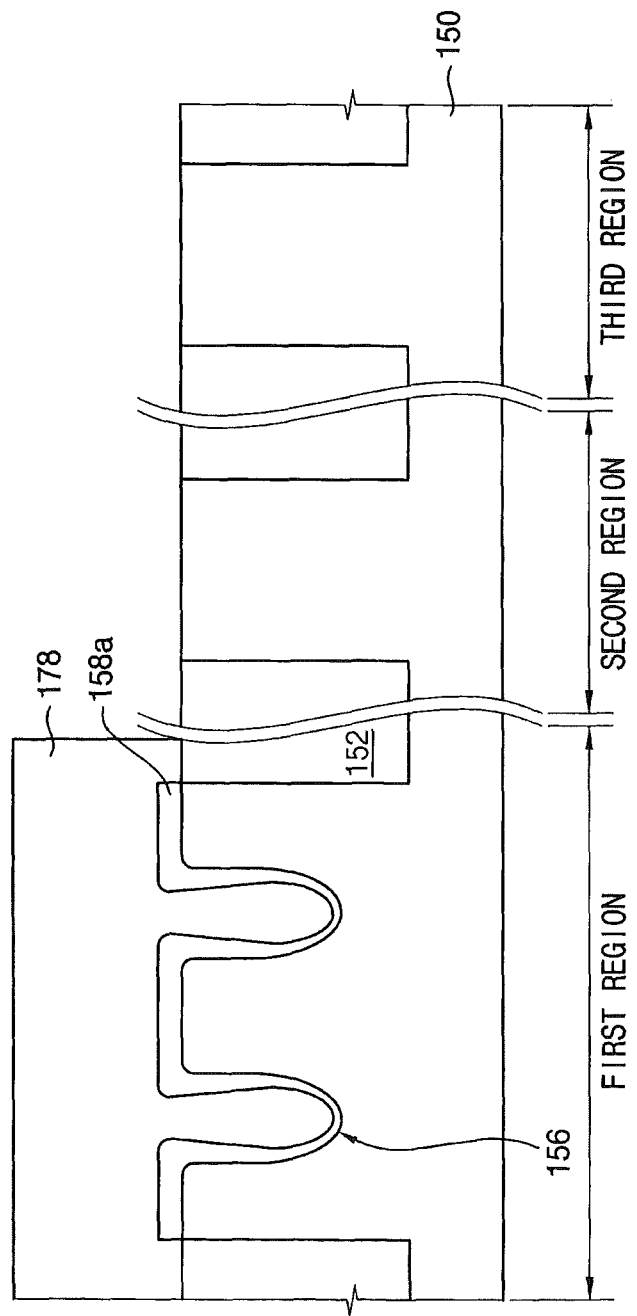

Referring to FIG. 15, a photoresist film (not shown) may be formed on the semiconductor substrate 150 and the first gate oxide layer 158a. The photoresist film may be patterned by a photolithography process to form a photoresist pattern 178 configured to cover the first region of the semiconductor substrate 150. Thus, the first gate oxide layer 158a on the second region and the third region of the semiconductor substrate 150 may be exposed through the photoresist pattern 178.

The first gate oxide layer 158a on the second region and the third region of the semiconductor substrate 150 may be partially etched to form a second gate oxide layer 180. In some example embodiments, the second gate oxide layer 180 may have a thickness less than that of the first gate oxide layer 178. The photoresist pattern 178 may then be removed by an ashing process and/or a stripping process, among others.

Figure 16:
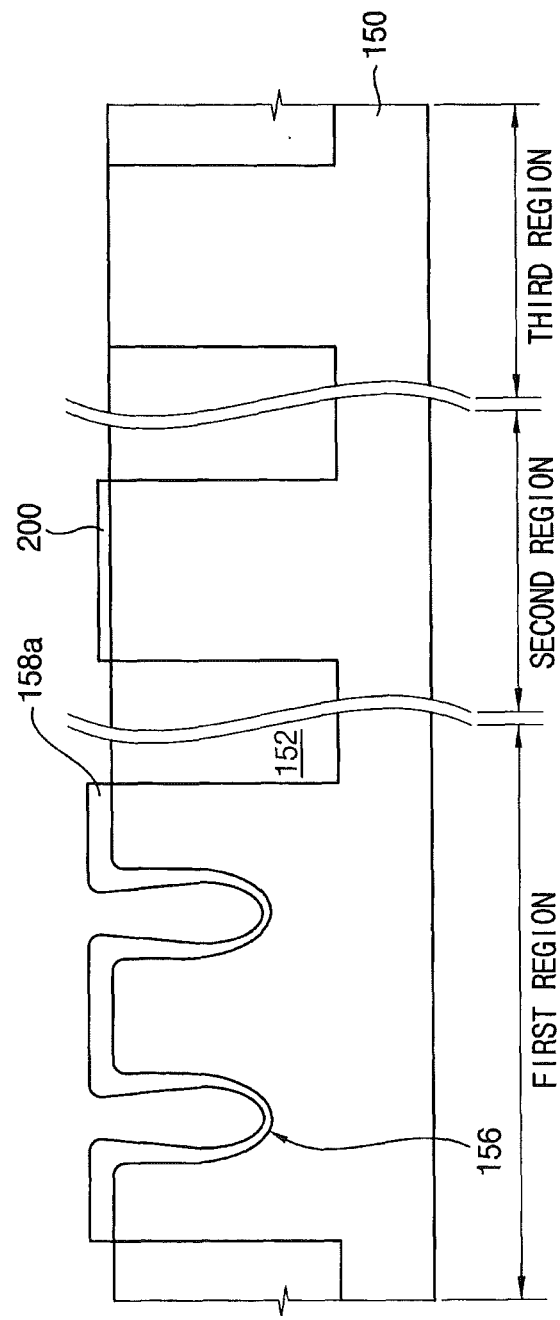

Referring to FIG. 16, a second gate oxide layer 200 may be formed on the second region and the third region (not shown) of the semiconductor substrate 150. In some example embodiments, the second gate oxide layer 200 may have a thickness less than that of the first gate oxide layer 158a.

In some example embodiments, the second gate oxide layer 200 may be formed by a plasma oxidation process and a rinsing process using H2O. Alternatively, the second gate oxide layer 200 may be formed by a thermal oxidation process such as a dry oxidation process, a wet oxidation process, a clean oxidation process, a radical oxidation process, etc.

A photoresist pattern (not shown) may be formed on the semiconductor substrate 150 and the second gate oxide layer 200. The second gate oxide layer 200 may be etched using the photoresist pattern as an etch mask to remove a portion of the second gate oxide layer 200 in the third region. Thus, the second gate oxide layer 200 may remain in the second region of the semiconductor substrate 150.

Figure 17:
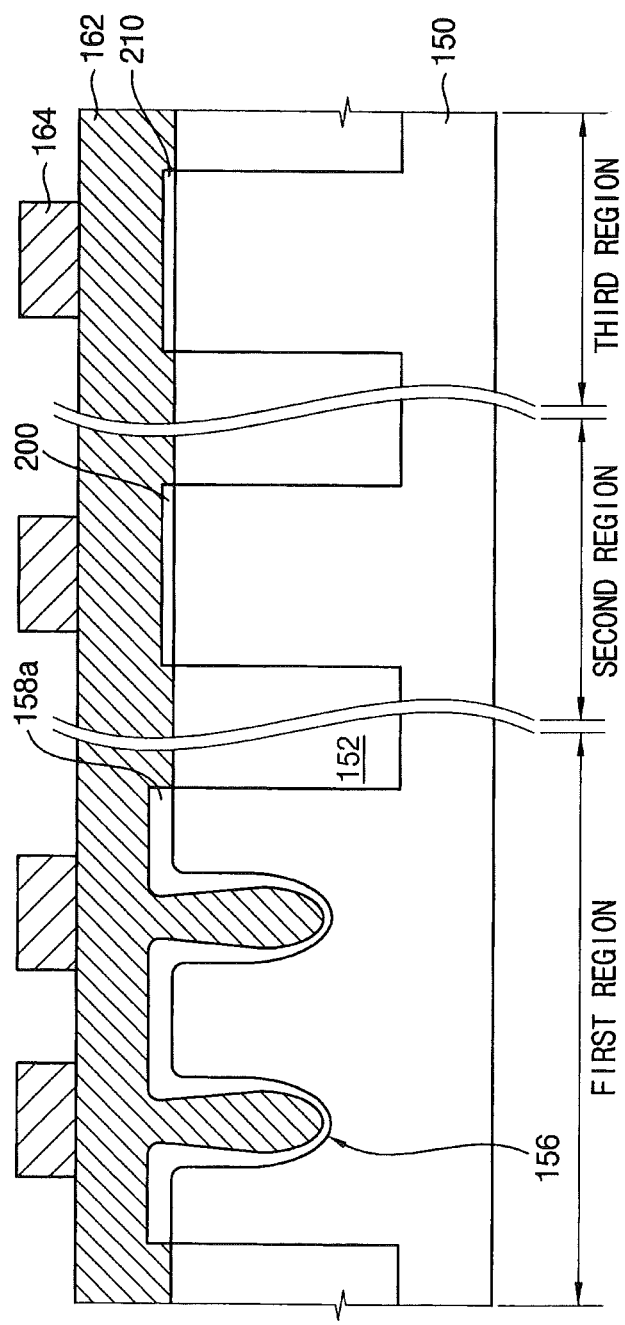

Referring to FIG. 17, a third gate oxide layer 210 may be formed on the third region of the semiconductor substrate 150. In some example embodiments, the third gate oxide layer 210 may have a thickness less than that of the second gate oxide layer 200. The third gate oxide layer 210 may be formed by a thermal oxidation process such as a dry oxidation process, a wet oxidation process, a clean oxidation process, a radical oxidation process, etc.

A gate conductive layer 162 may be formed on the first gate oxide layer 158a, the second gate oxide layer 200 and the third gate oxide layer 210. In some embodiments, the gate conductive layer 162 may be formed on the semiconductor substrate 150 to fill up the recess 156. Some embodiments provide that an upper surface of the gate conductive layer 162 may be planarized by a CMP process and/or an etch-back process. A hard mask pattern 164 may be formed on the gate conductive layer 162.

Figure 18:
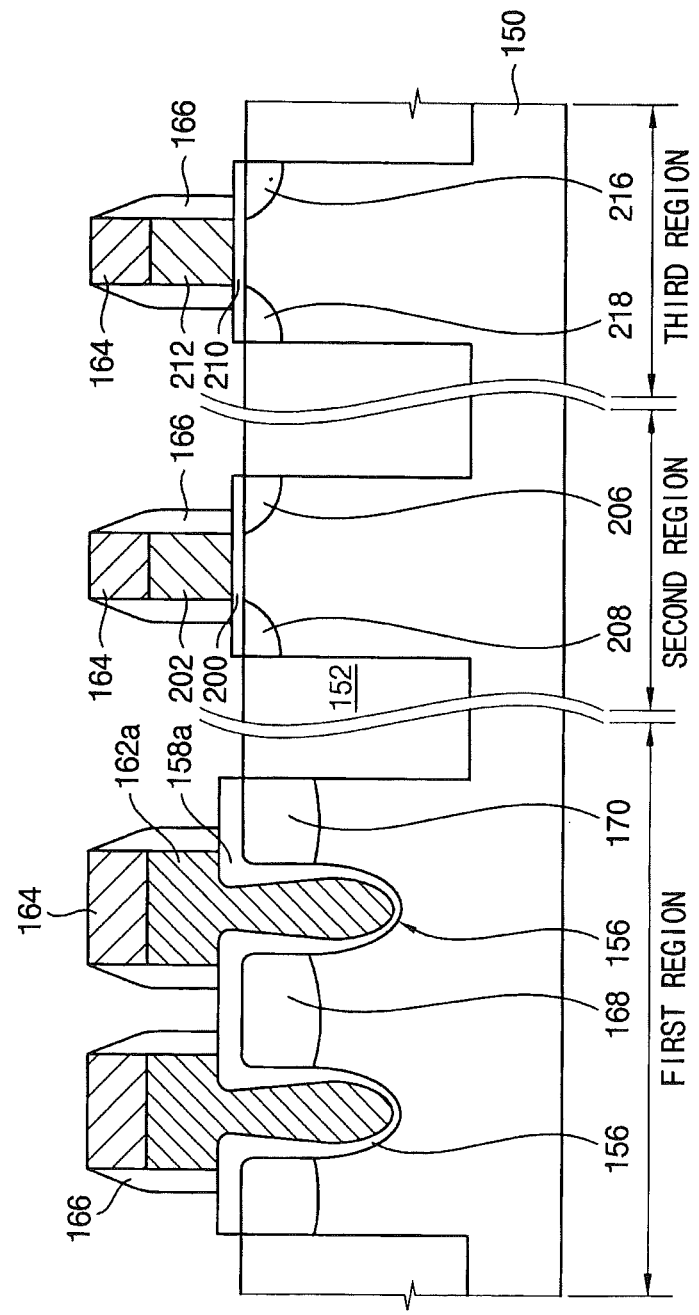

Referring to FIG. 18, the gate conductive layer 162 may be etched using the hard mask pattern 164 as an etch mask to form a first gate electrode 162a in the first region, a second gate electrode 202 in the second region, and a third gate electrode 212 in the third region. Spacers 166 may be formed on sidewalls of the first gate electrode 162a, the second gate electrode 202 and the third gate electrode 212, respectively.

Impurities may be implanted into the semiconductor substrate 150 at both sides of the first gate electrode 162a, the second gate electrode 202 and the third gate electrode 212, respectively, to form first source/drain regions 168 and 170 at both sides of the first gate electrode 162a, second source/ drain regions 206 and 208 at both sides of the second gate electrode 202, and third source/drain regions 216 and 218 at both sides of the third gate electrode 212.

In some embodiments, the first source/drain regions 168 and 170, the second source/drain regions 206 and 208 and the third source/drain regions 216 and 218 may be formed by substantially the same impurity ion implantation process. In some embodiments, the first source/drain regions 168 and 170, the second source/drain regions 206 and 208 and the third source/drain regions 216 and 218 may be formed by different impurity ion implantation processes.

Particularly, a first ion implantation mask may be formed on the semiconductor substrate 150 to expose the first region of the semiconductor substrate 150. Impurities may be implanted into the semiconductor substrate 150 using the first ion implantation mask to form the first source/drain regions 168 and 170. A second ion implantation mask may be formed on the semiconductor substrate 150 to expose the second region of the semiconductor substrate 150. Impurities may be implanted into the semiconductor substrate 150 using the second ion implantation mask to form the second source/drain regions 206 and 208. A third ion implantation mask may be formed on the semiconductor substrate 150 to expose the third region of the semiconductor substrate 150. Impurities may be implanted into the semiconductor substrate 150 using the third ion implantation mask to form the third source/drain regions 216 and 218.

Figure 19:
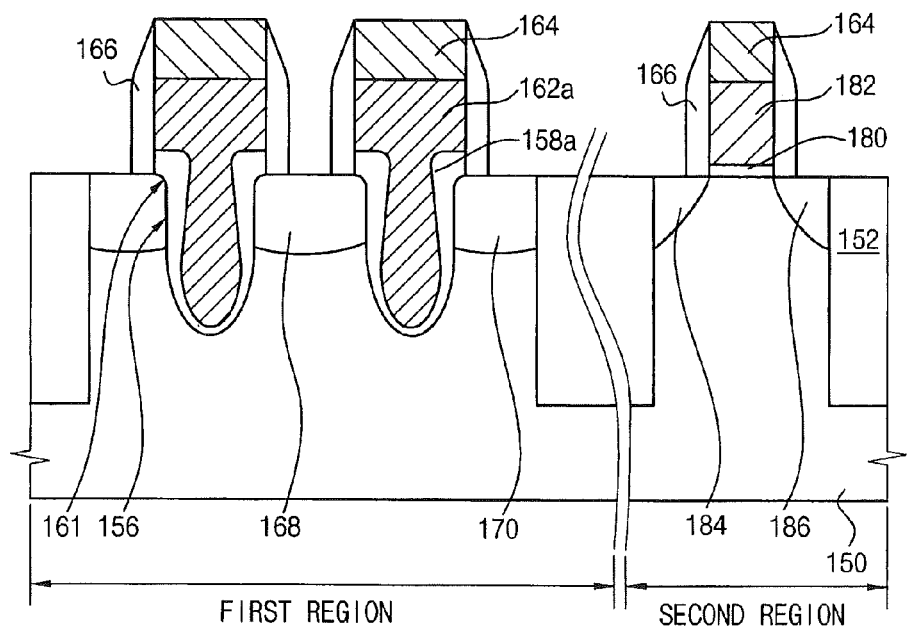
FIG. 19 is a cross-sectional view illustrating a semiconductor device including the recessed channel array transistor in FIG. 4.
Figure 20:
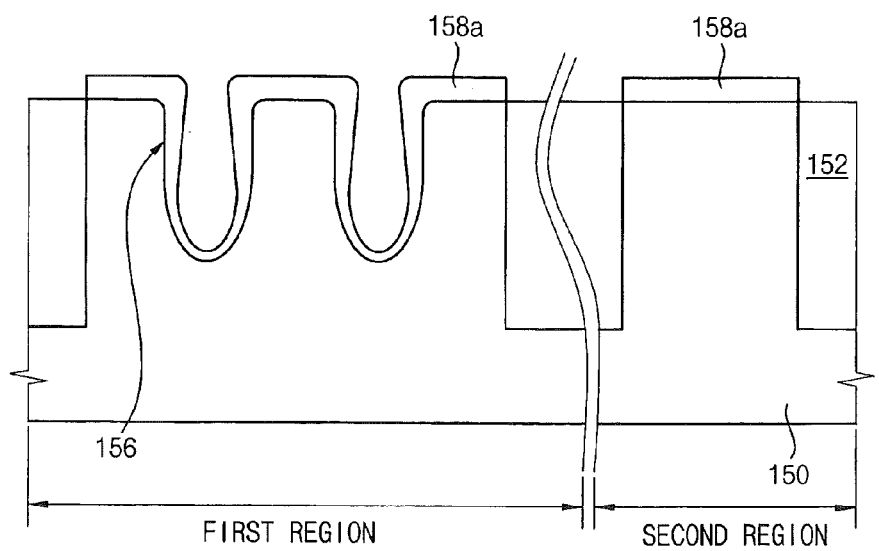
FIGS. 20 to 22 are cross-sectional views illustrating methods of manufacturing the semiconductor device in FIG. 19.
Figure 21:
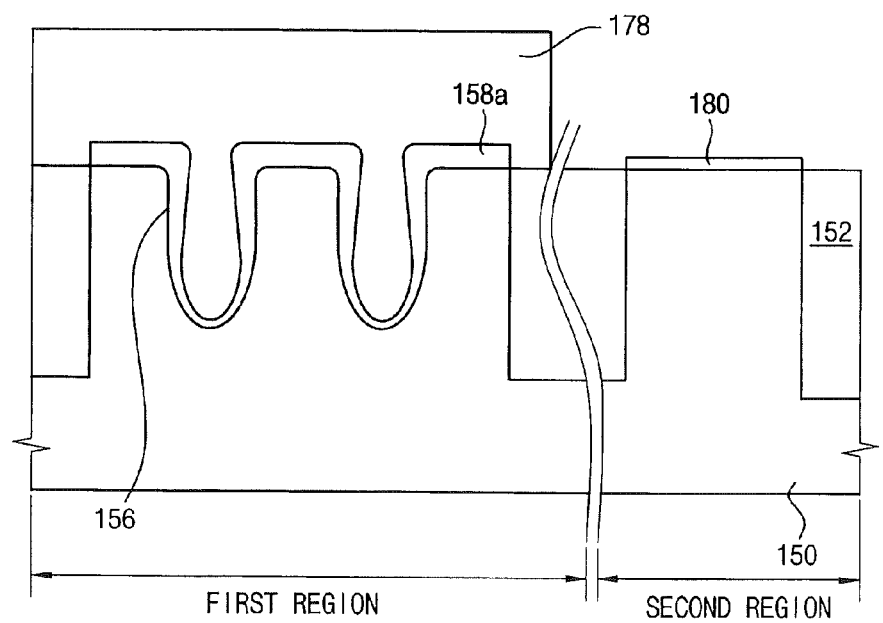
Figure 22:
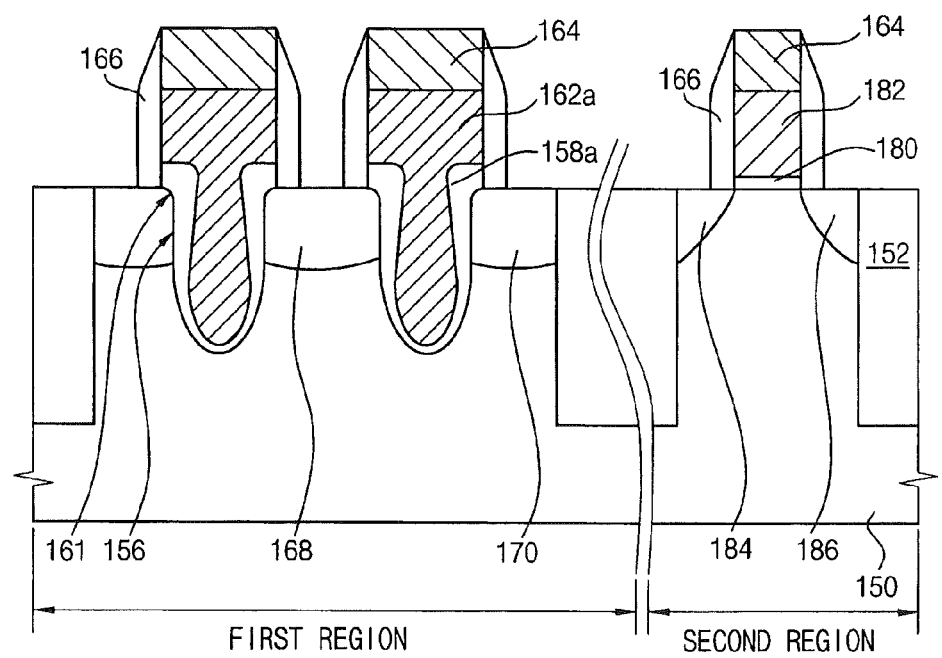

FIGS. 20 to 22 are cross-sectional views illustrating methods of manufacturing the semiconductor device in FIG. 19.

Referring to FIG. 20, a shallow trench isolation process may be performed on a semiconductor substrate 150 having a first region and a second region to form an isolation layer pattern 152, thereby defining an active region and an isolation region of the semiconductor substrate 150. In some embodiments, the active region in the first region may have an isolated island shape. The isolation layer pattern 152 may be configured to surround the active region.

The active region in the first region may be partially etched to form a recess 156. Here, the process for forming the recess 156 may be substantially the same as that described above and illustrated with reference to FIG. 7.

A plasma oxidation process and a rinsing process using H$_2$O may be performed to form a first gate oxide layer 158a on an inner surface of the recess 156 and an upper surface of the semiconductor substrate 150. The processes for forming the first gate oxide layer 158a may be substantially the same as those described above and illustrated with reference to FIGS. 7 to 11.

Referring to FIG. 21, a photoresist film (not shown) may be formed on the semiconductor substrate 150 and the first gate oxide layer 158a. The photoresist film may be patterned by a photolithography process to form a photoresist pattern 178 configured to cover the first region of the semiconductor substrate 150. Thus, the first gate oxide layer 158a on the second region of the semiconductor substrate 150 may be exposed through the photoresist pattern 178.

The first gate oxide layer 158a on the second region of the semiconductor substrate 150 may be partially etched to form a second gate oxide layer 180. In some example embodiments, the second gate oxide layer 180 may have a thickness less than that of the first gate oxide layer 178. The photoresist pattern 178 may then be removed by an ashing process and/or a stripping process, among others.

A gate conductive layer (not shown) may be formed on the first gate oxide layer 158a and the second gate oxide layer 180. In some embodiments, the gate conductive layer may be formed on the semiconductor substrate 150 to fill up the recess 156. Some embodiments provide that an upper surface of the gate conductive layer may be planarized by a CMP process and/or an etch-back process.

A hard mask pattern 164 may be formed on the gate conductive layer 162. The gate conductive layer may be etched using the hard mask pattern 164 as an etch mask to form a first gate electrode 162a in the first region and a second gate electrode 182 in the second region. Spacers 166 may be formed on sidewalls of the first gate electrode 162a and the second gate electrode 182, respectively.

Impurities may be implanted into the semiconductor substrate 150 at both sides of the first gate electrode 162a and the second gate electrode 182, respectively, to form first source/drain regions 168 and 170 at both sides of the first gate electrode 162a, and second source/drain regions 184 and 186 at both sides of the second gate electrode 182.

In some embodiments, the first source/drain regions 168 and 170, and the second source/drain regions 184 and 186 may be formed by substantially the same impurity ion implantation process. In some embodiments, the first source/drain regions 168 and 170, and the second source/drain regions 184 and 186 may be formed by different impurity ion implantation processes.

Particularly, a first ion implantation mask may be formed on the semiconductor substrate 150 to expose the first region of the semiconductor substrate 150. Impurities may be implanted into the semiconductor substrate 150 using the first ion implantation mask to form the first source/drain regions 168 and 170. A second ion implantation mask may be formed on the semiconductor substrate 150 to expose the second region of the semiconductor substrate 150. Impurities may be implanted into the semiconductor substrate 150 using the second ion implantation mask to form the second source/drain regions 184 and 186.

Figure 23:
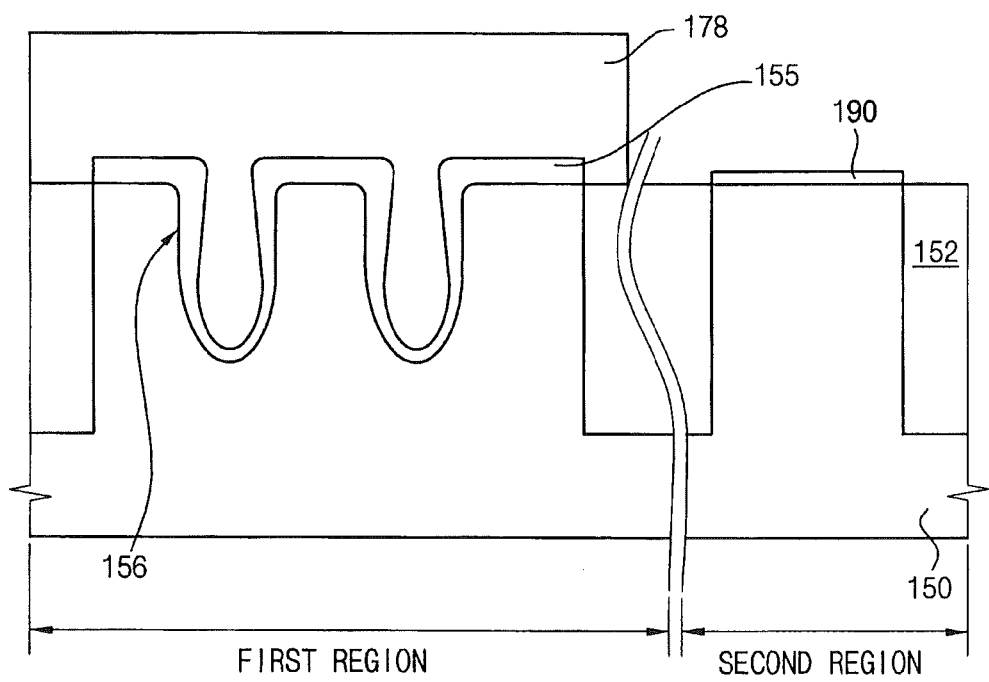
FIGS. 23 to 25 are cross-sectional views illustrating methods of manufacturing the semiconductor device in FIG. 19.
Figure 24:
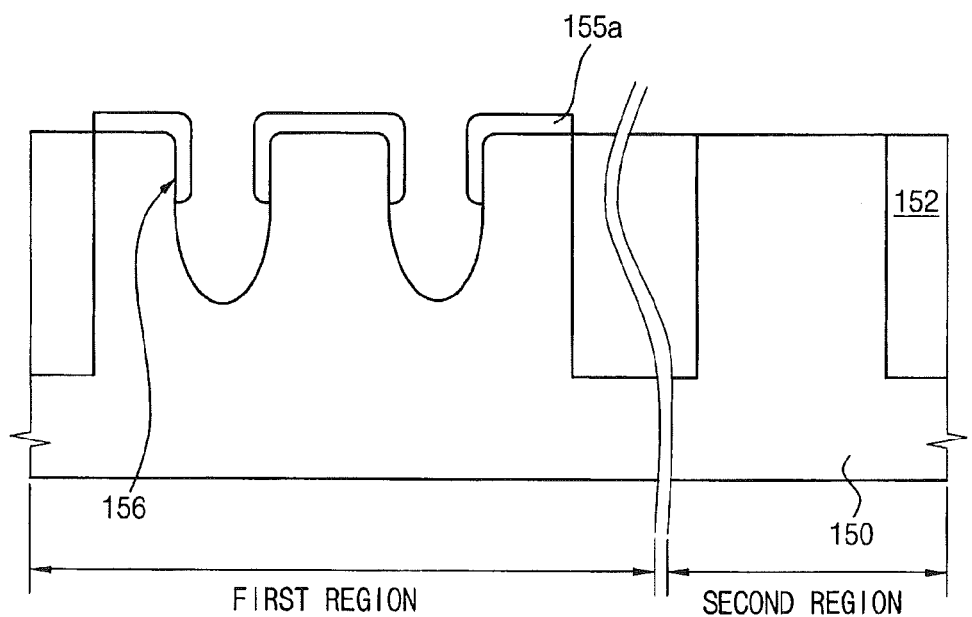
Figure 25:
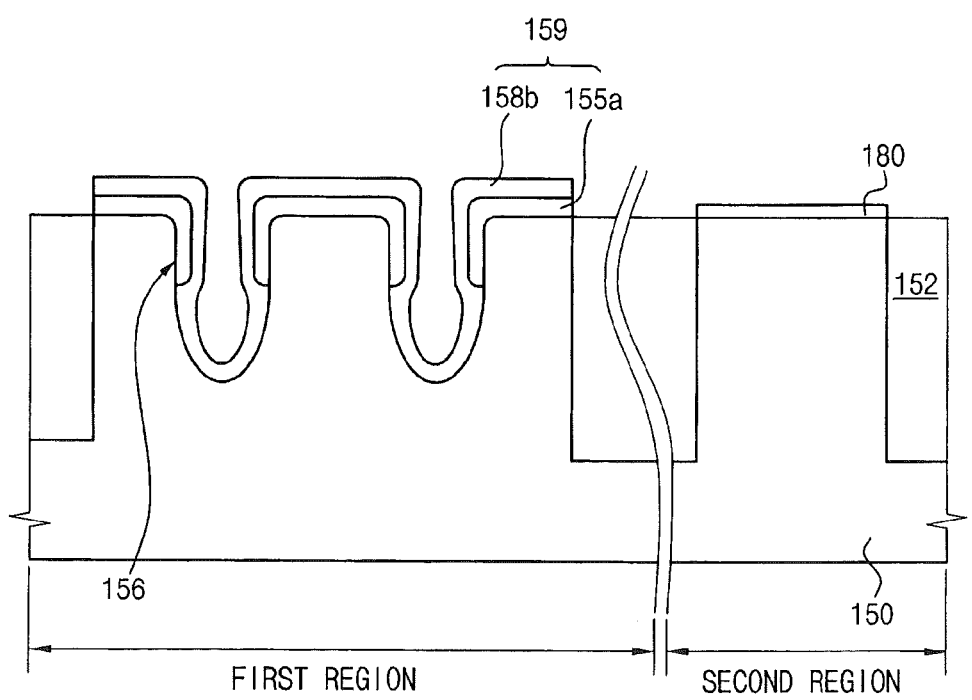

FIGS. 23 to 25 are cross-sectional views illustrating methods of manufacturing the semiconductor device in FIG. 19 in accordance with some embodiments of the present invention.

Here, method of these embodiments may be substantially similar as those with reference to FIGS. 20 to 22 except for a process for forming a gate oxide layer. Thus, any further illustrations with respect to the same processes are omitted herein for brevity.

Referring to FIG. 23, an isolation layer pattern 152 may be formed in a semiconductor substrate 150 having a first region and a second region. The first region of the semiconductor substrate 150 may be partially etched to form a recess 156.

A plasma oxidation process and a rinsing process using H$_2$O may be performed on the semiconductor substrate 150 to form a first preliminary gate oxide layer 155 on an upper surface of the semiconductor substrate 150 and an inner surface of the recess 156. In some embodiments, the first preliminary gate oxide layer 155 may have a gradually decreased thickness from a side upper surface of the recess 156 to a side lower surface of the recess 156. A first portion of the first preliminary gate oxide layer 155 on a first corner where a side edge of the recess 156 and a sidewall of the active region may be intersected with each other may have a thickness greater than about 70% of a thickness of a second portion of the first preliminary gate oxide layer 155 on a side surface of the recess 156.

Here, the process for forming the first preliminary gate oxide layer 155 may be substantially the same as that illustrated with reference to FIGS. 8 to 11.

A photoresist film (not shown) may be formed on the semiconductor substrate 150 and the first preliminary gate oxide layer 155. The photoresist film may be patterned by a photolithography process to form a photoresist pattern 178 configured to expose the first preliminary gate oxide layer 155 in the second region of the semiconductor substrate 150.

The first preliminary gate oxide layer 155 in the second region of the semiconductor substrate 150 may be partially etched using the photoresist pattern 179 as an etch mask to form a second preliminary gate oxide layer 190 having a thickness less than that of the first preliminary gate oxide layer 155. In some embodiments, the first preliminary gate oxide layer 155 in the second region of the semiconductor substrate 150 may be completely removed. The photoresist pattern 179 may be removed by an ashing process and/or a stripping process, among others.

Referring to FIG. 24, the first preliminary gate oxide layer 155 may be partially etched by a wet etching process using an HF diluted solution. Here, the first preliminary gate oxide layer 155 may have a low etching selectivity with respect to the wet etching process and a dense structure, so that an etched thickness of the first preliminary gate oxide layer 155 may be accurately controlled.

After performing the wet etching process, portions of the first preliminary gate oxide layer 155 having a relatively thick thickness may remain. Thus, portions of the first preliminary gate oxide layer 155 on the side upper surface of the recess 156 and the upper surface of the first region of the semiconductor substrate 150 may remain. In contrast, portions of the first preliminary gate oxide layer 155 on the side lower surface of the recess 156 and the upper surface of the second region of the semiconductor substrate 150 may be completely removed.

Referring to FIG. 25, a thermal oxidation process may be performed on the remaining first preliminary gate oxide layer 155 to form a first gate oxide layer structure 159 including a first oxide layer pattern 155a and a thermal oxide layer 158a sequentially stacked in the first region, and a second gate oxide layer 180 including only a thermal oxide layer in the second region. In some embodiments, the thermal oxidation process may include a dry oxidation process, a wet oxidation process, a clean oxidation process, and/or a radical oxidation process, among others. In some embodiments, the first gate oxide layer structure 159 and the second gate oxide layer 180 formed by the thermal oxidation process may have a uniform thickness.

Some embodiments provide that the first gate oxide layer pattern 155a and the oxide layer 158a formed by the thermal oxidation process may be sequentially stacked on the side upper surface of the recess 156. Therefore, an upper portion of the first gate oxide layer structure 159 on the side upper surface of the recess 156 may have a thickness less than that of a lower portion of the first gate oxide layer structure 159 on the side lower surface of the recess 156. In some embodiments, the second gate oxide layer 180 may include oxide formed by a thermal oxidation.

Further, the oxide layer in the first region between the source/drain regions and the gate electrode of the recessed channel array transistor may have a relatively thick thickness. Furthermore, the oxide layer on the channel region of the recessed channel array transistor may have a relatively thin thickness.

Processes substantially the same as those illustrated with reference to FIG. 22 may be performed to form a first gate electrode 162a, a second gate electrode 182, a hard mask pattern 164, a gate spacer 166, first source/drain regions 168 and 170 and/or second source/drain region 184 and 186, thereby completing the semiconductor device in FIG. 19.

Figure 26:
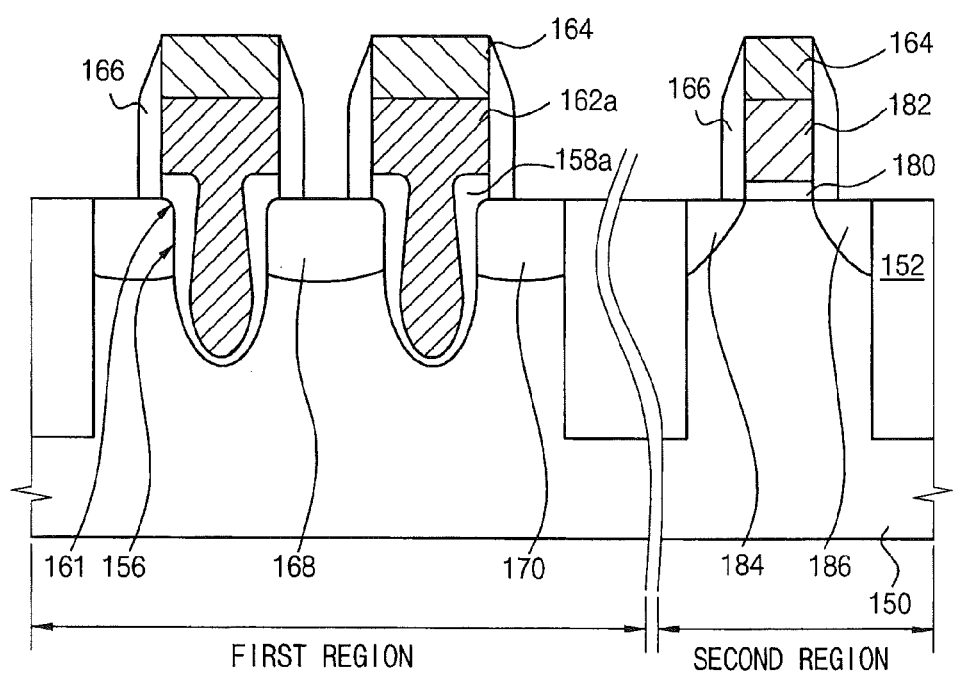
FIG. 26 is a cross-sectional view illustrating a semiconductor device in accordance with some embodiments of the present invention.

FIG. 26 is a cross-sectional view illustrating a semiconductor device in accordance with some embodiments of the present invention. The semiconductor device of such embodiments may include elements substantially the same as those of the semiconductor device in FIG. 19 except for a thickness of a gate oxide layer. Thus, the same reference numerals refer to the same elements and any further illustrations with respect to the same elements may be omitted herein for brevity.

Referring to FIG. 26, a semiconductor substrate 150 may have a first region and a second region. The semiconductor substrate 150 may include single crystalline silicon. The first region may correspond to a memory cell region. The second region may correspond to a peripheral circuit region.

The recessed channel array transistor in FIG. 4 may be formed on the first region of the semiconductor substrate 150. A planar transistor may be formed on the second region of the semiconductor substrate 150.

In some embodiments, a second gate oxide layer 180 of the planar transistor may have a thickness substantially the same as that of a first gate oxide layer 158a of the recessed channel array transistor on the first region of the semiconductor substrate 150. The first gate oxide layer 158a and the second gate oxide layer 180 may be formed by substantially the same plasma oxidation process. Particularly, the first gate oxide layer 158a of the recessed channel transistor may have a thickness substantially the same as that of the planar transistor.

A first gate electrode 162a and a hard mask pattern 164 may be sequentially formed on the first gate oxide layer 158a. A second gate electrode 182 and the hard mask pattern 164 may be sequentially formed on the second gate oxide layer 180. Spacers 166 may be formed on sidewalls of the first gate electrode 162a and the second gate electrode 182, respectively.

First source/drain regions 168 and 170 may be formed in the semiconductor substrate 150 at both sides of the first gate electrode 162a. Second source/drain regions 184 and 186 may be formed in the semiconductor substrate 150 at both sides of the second gate electrode 182.

According to some embodiments, the first gate oxide layer of the recessed channel array transistor in the first region may have the thickness substantially the same as that of the second gate oxide layer of the planar transistor in the second region. Further, the first gate oxide layer and the second oxide layer may be formed by the single oxidation process. Thus, the semiconductor device may be manufactured by the simple processes.

Figure 27:
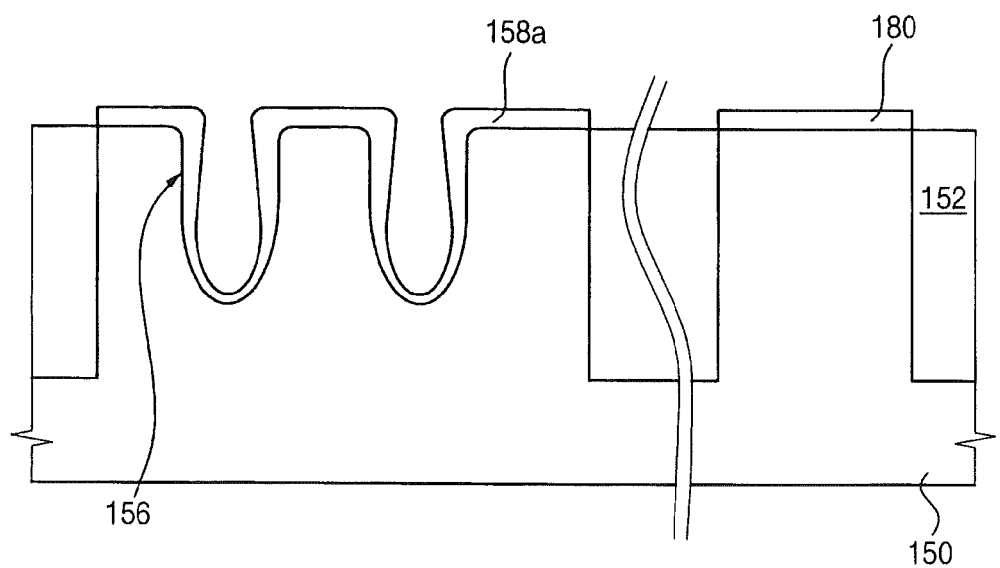
FIG. 27 is a cross-sectional view illustrating methods of manufacturing the semiconductor device in FIG. 26.

FIG. 27 is a cross-sectional view illustrating methods of manufacturing the semiconductor device in FIG. 26.

Referring to FIG. 27, an isolation layer pattern 152 may be formed in a semiconductor substrate 150 having a first region and a second region to define an active region and an isolation region of the semiconductor substrate 150. The active region in the first region may have an isolated island shape. The isolation layer pattern 152 may be configured to surround the active region.

The first region of the semiconductor substrate 150 may be partially etched to form a recess 156. Here, the process for forming the recess 156 may be substantially the same as that illustrated with reference to FIG. 7.

A plasma oxidation process and a rinsing process using $H_2O$ may be performed on the upper surface of the semiconductor substrate 150 and the inner surface of the recess 156 to form a first gate oxide layer 158a in the first region and a second gate oxide layer 180 in the second region. In some embodiments, the first gate oxide layer 158a and the second gate oxide layer 180 may be formed by the single oxidation process. The first gate oxide layer 158a may have a shape substantially the same as that described above and illustrated with reference to FIGS. 8 to 11.

Processes substantially the same as those illustrated with reference to FIG. 22 may be performed to complete the semiconductor device in FIG. 26.

According to some embodiments, methods may not require a process for removing the oxide layer to form the gate oxide layer of the planar transistor. Thus, the semiconductor device may be manufactured using simple processes.

Figure 28:
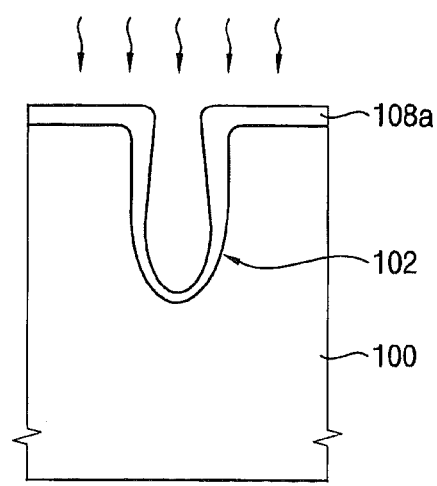
FIG. 28 is a cross-sectional view illustrating methods of forming the recessed channel array transistor in accordance with some embodiments of the present invention.

FIG. 28 is a cross-sectional view illustrating methods of forming an oxide layer in accordance with some example embodiments.

A semiconductor substrate 100 may be etched to form a recess 102. A plasma oxidation process may be performed to form a preliminary oxide layer 106 on an inner surface of the recess 102 and an upper surface of the semiconductor substrate 100. Here, the processes for forming the recess 102 and the preliminary oxide layer 106 may be substantially the same as those illustrated with reference to FIGS. 1 and 2.

Referring to FIG. 28, the preliminary oxide layer 106 may be thermally oxidized. In some example embodiments, the thermal oxidation process may be performed at a temperature higher than that of the plasma oxidation process. For example, the thermal oxidation process may be performed at a temperature of about 800° C. to about 1,100° C. The thermal oxidation process may provide the preliminary oxide layer 106 with a dense structure.

In some example embodiments, moistures may be absorbed in the preliminary oxide layer 106 during the thermal oxidation process to form an oxide layer 108a. The moisture absorption process may include applying $H_2$ and $O_2$ or $H_2O$ to the preliminary oxide layer 106 during a last step, i.e., a ramp down step of the thermal oxidation process.

Hereinafter, the thermal oxidation process and the moisture absorption process may be illustrated in detail.

Figure 29:
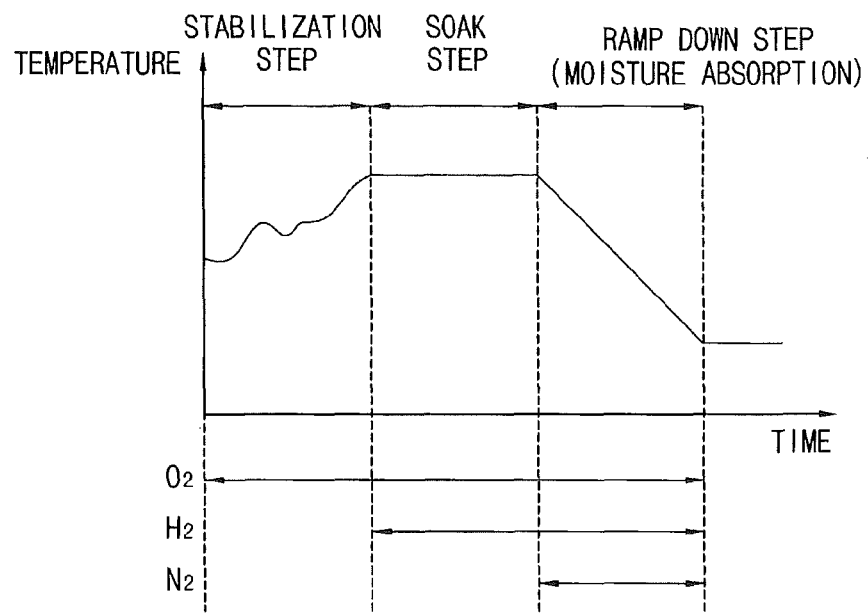
FIG. 29 is a timing chart showing an additional thermal oxidation process and a moisture absorption process in accordance with some embodiments of the present invention.

FIG. 29 is a timing chart showing the thermal oxidation process and the moisture absorption process according to some embodiments of the present invention.

Referring to FIG. 29, a stabilization process may be performed to gradually increase a temperature in a chamber to an oxidation temperature. In some example embodiments, the stabilization process may include introducing an oxygen gas into the chamber.

When the temperature in the chamber may approach at the oxidation process, a soak process may be performed to oxidize the preliminary oxide layer 106 under a condition that the oxidation temperature in the chamber may be maintained. In some example embodiments, the soak process may include introducing an oxygen gas and a hydrogen gas into the chamber.

After oxidizing the preliminary oxide layer 106, a ramp down process may be performed to gradually decrease the temperature in the chamber. The ramp down process may include the moisture absorption process. Thus, the ramp down process may include introducing an oxygen gas and a hydrogen gas or $H_2O$ into the chamber. Alternatively, the moisture absorption process during the ramp down process may be performed by other processes.

Figure 30:
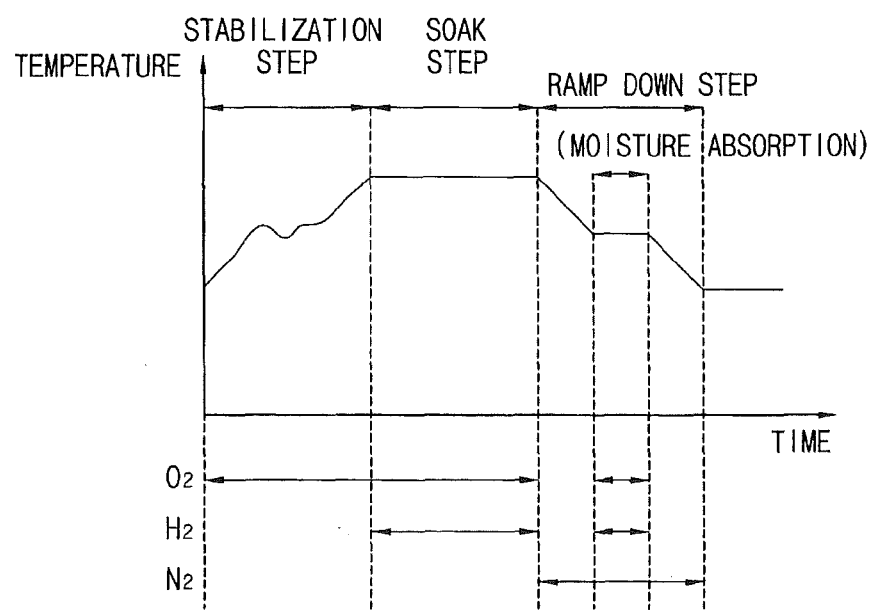
FIG. 30 is a timing chart showing an additional thermal oxidation process and a moisture absorption process in accordance with some embodiments of the present invention.

FIG. 30 is a timing chart showing the thermal oxidation process and the moisture absorption process according to some embodiments of the present invention.

Referring to FIG. 30, a stabilization process and a soak process substantially the same as those illustrated with reference to FIG. 29 may be performed. A ramp down process may be performed to gradually decrease the temperature in the chamber.

In some example embodiments, the ramp down process may include gradually decreasing the temperature in the chamber to a temperature suitable for performing the moisture absorption process. Here, only a nitrogen gas, not an oxygen gas and a hydrogen gas or $H_2O$ may be introduced into the chamber. When the temperature in the chamber may approach to the moisture absorption temperature, the moisture absorption temperature may be maintained in the chamber. The moisture absorption temperature may be about 100° C. to about 500° C. Further, the moisture absorption temperature in the chamber may be maintained for several seconds to several minutes, preferably about 1 minute to about 2 minutes. An oxygen gas and a hydrogen gas or $H_2O$ may be introduced into the chamber during the moisture absorption temperature in the chamber may be maintained. The temperature in the chamber may be decreased to a final ramp down temperature. Here, only a nitrogen gas, not an oxygen gas and a hydrogen gas or $H_2O$ may be introduced into the chamber.

According to such embodiments, the moisture absorption process may be performed during the thermal oxidation process. Thus, a thickness of the oxide layer may not be increased in accordance with a standby time. Particularly, the oxygen gas and the hydrogen gas or $H_2O$ may be introduced into the chamber at a temperature of about 100° C. to about 500° C. during the thermal oxidation process; so that dangling bonds on the preliminary oxide layer may be bonded with the oxygen gas, thereby curing the oxide layer. Thus, because the dangling bonds on the preliminary oxide layer may be removed by the moisture absorption process, the thickness of the oxide layer may not be increased any more during the standby time. As a result, the oxide layer may have a uniform thickness distribution, so that the semiconductor device may have uniform characteristics.

Figure 31:
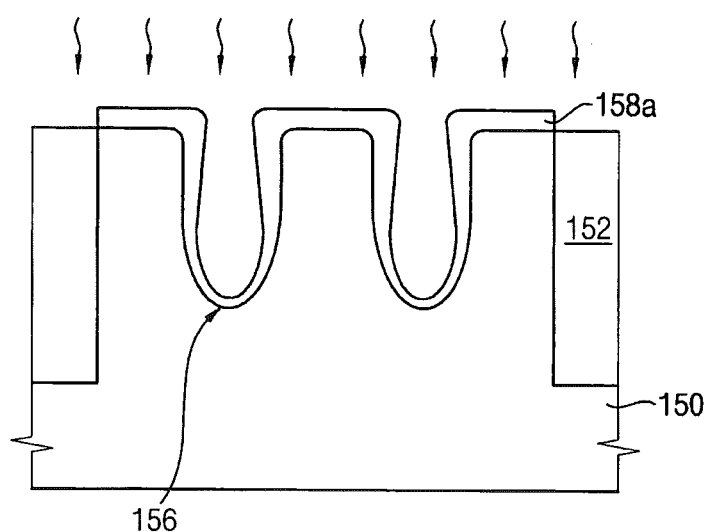
FIG. 31 is a cross-sectional view illustrating a method of forming the recessed channel transistor in FIG. 4.

FIG. 31 is a cross-sectional view illustrating methods of manufacturing the recessed channel transistor in FIG. 4.

Processes substantially the same as those illustrated with reference to FIGS. 7 and 8 may be performed to form a preliminary gate oxide layer 158.

Referring to FIG. 31, a thermal oxidation process and a moisture absorption process may be performed on the preliminary gate oxide layer 158 to form a gate oxide layer 158a. In some example embodiments, the thermal oxidation process and the moisture absorption process may be substantially the same as those illustrated with reference to FIGS. 28 and 29 or FIGS. 28 and 30.

Processes substantially the same as those illustrated with reference to FIGS. 4 and 12 may be performed to complete the recessed channel transistor in FIG. 4.

Figure 32:
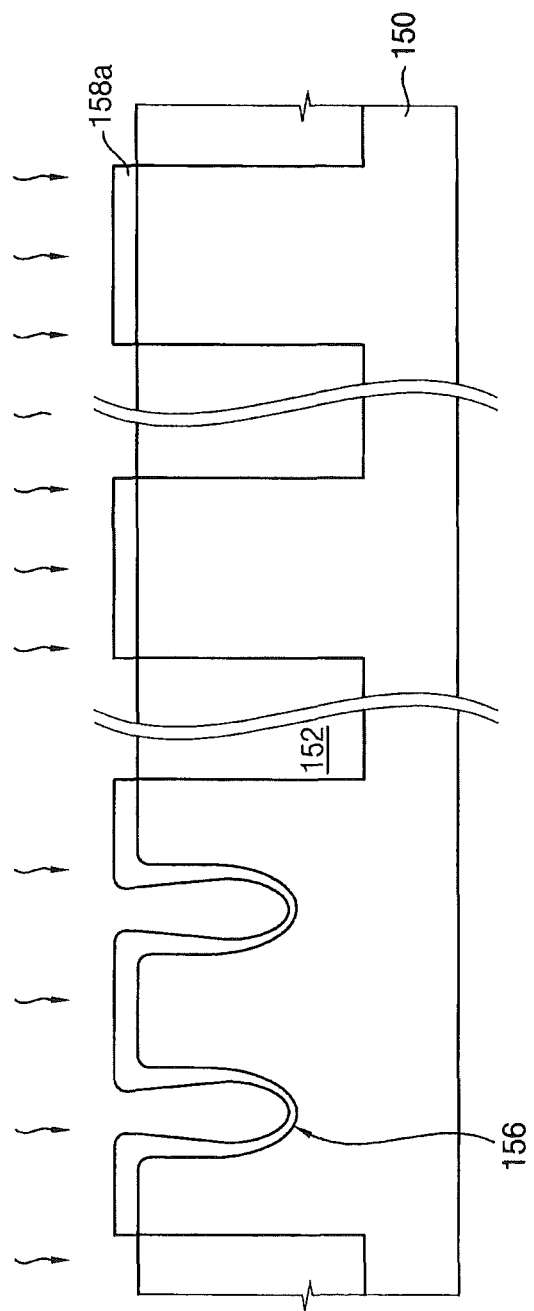
FIG. 32 is a cross-sectional view illustrating a method of forming the recessed channel transistor in FIG. 13.

FIG. 32 is a cross-sectional view illustrating methods of manufacturing the recessed channel transistor in FIG. 13.

Processes substantially the same as those illustrated with reference to FIG. 14 may be performed to form a first preliminary gate oxide layer (not shown).

Referring to FIG. 32, a thermal oxidation process and a moisture absorption process may be performed on the preliminary gate oxide layer to form a gate oxide layer 158a. In some example embodiments, the thermal oxidation process and the moisture absorption process may be substantially the same as those illustrated with reference to FIGS. 28 and 29 or FIGS. 28 and 30.

Processes substantially the same as those illustrated with reference to FIGS. 15 to 18 may be performed to complete the recessed channel transistor in FIG. 13.

Figure 33:
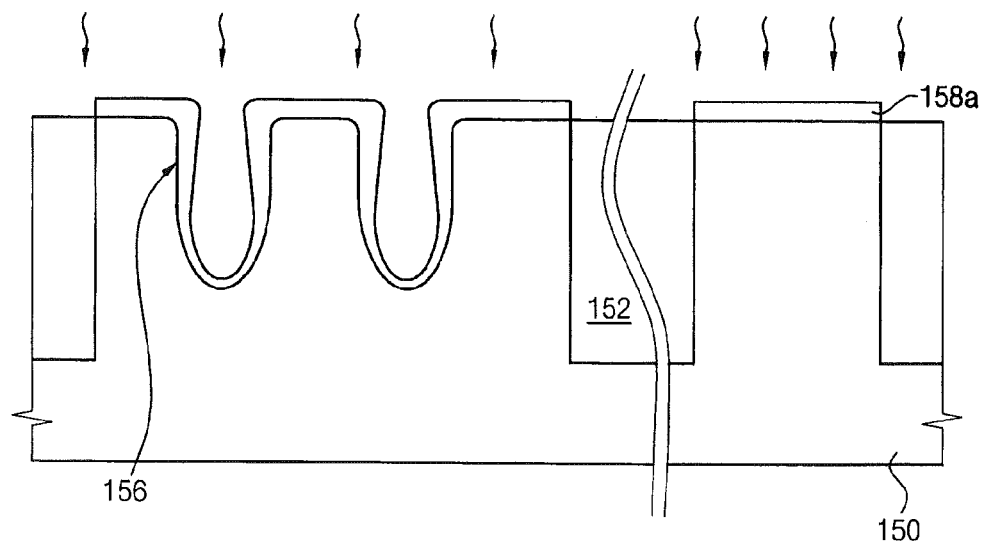
FIG. 33 is a cross-sectional view illustrating a method of forming the recessed channel transistor in FIG. 19.

FIG. 33 is a cross-sectional view illustrating methods of manufacturing the recessed channel transistor in FIG. 19.

Processes substantially the same as those illustrated with reference to FIG. 20 may be performed to form an isolation layer pattern 152. A recess 156 may be formed at a first region of the semiconductor substrate. A plasma oxidation process may be performed to form a preliminary gate oxide layer (not shown). Here, the method of this example embodiment may not include a rinsing process.

Referring to FIG. 33, a thermal oxidation process and a moisture absorption process may be performed on the preliminary gate oxide layer to form a gate oxide layer 158a. In some example embodiments; the thermal oxidation process and the moisture absorption process may be substantially the same as those illustrated with reference to FIGS. 28 and 29 or FIGS. 28 and 30.

Processes substantially the same as those illustrated with reference to FIGS. 21 and 22 may be performed to complete the recessed channel transistor in FIG. 19.

Alternatively, after forming the gate oxide layer 158a by the thermal oxidation process and the moisture absorption process, processes substantially the same as those illustrated with reference to FIGS. 23 to 25 may be performed to complete the recessed channel transistor in FIG. 19.

Methods of manufacturing the recessed channel transistor in FIG. 26 in accordance with some example embodiments may be illustrated.

Processes substantially the same as those illustrated with reference to FIG. 27 may be performed to form an isolation layer pattern 152. A recess 156 may be formed at a first region of the semiconductor substrate. A plasma oxidation process may be performed to form a first preliminary gate oxide layer (not shown) and a second preliminary gate oxide layer. Here, the method of this example embodiment may not include a rinsing process.

A thermal oxidation process and a moisture absorption process may be performed on the first preliminary gate oxide layer and the second preliminary gate oxide layer to form a first gate oxide layer 158a and a second gate oxide layer 180. In some example embodiments, the thermal oxidation process and the moisture absorption process may be substantially the same as those illustrated with reference to FIGS. 28 and 30. The first gate oxide layer 158a and the second gate oxide layer 180 of transistor in the first region and the second region may have substantially the same thickness.

Processes substantially the same as those illustrated with reference to FIG. 22 may be performed to complete the recessed channel transistor in FIG. 26.

Methods of forming an oxide layer in accordance with some example embodiments may be illustrated.

Processes substantially the same as those illustrated with reference to FIGS. 1 and 2 may be performed to form a recess 156 at an upper surface of the semiconductor substrate. A plasma oxidation process may be performed to form a preliminary oxide layer 106. A thermal oxidation process may be performed on the preliminary oxide layer 106.

The preliminary oxide layer 106 may be exposed to atmosphere for about 1 hour to about 10 hours. Moistures may be absorbed in the preliminary oxide layer 106 to remove dangling bonds in the preliminary oxide layer 106, thereby forming an oxide layer. Thus, the oxide layer may have a uniform thickness distribution by exposing the preliminary oxide layer 106 to the atmosphere.

In some example embodiments, the moisture absorption process may densify a structure of the oxide layer. Therefore, the oxide layer may be slowly etched compared to the preliminary oxide layer during a following wet etching process. Further, a deviation of an etched amount of the oxide layer may be reduced.

Methods of manufacturing a recessed channel transistor in FIG. 4 in accordance with some example embodiments may be illustrated.

Processes substantially the same as those illustrated with reference to FIGS. 7 and 8 may be performed to form a preliminary gate oxide layer 158. A thermal oxidation process and a moisture absorption process may be performed on the preliminary gate oxide layer 158 to form the gate oxide layer 158a. In some example embodiments, the moisture absorption process may include exposing the preliminary gate oxide layer 158 for about 1 hour to about 10 hours.

Processes substantially the same as those illustrated with reference to FIGS. 12 and 4 may be performed to complete the recessed channel transistor in FIG. 4.

Methods of manufacturing a recessed channel transistor in FIG. 13 in accordance with some example embodiments may be illustrated.

Processes substantially the same as those illustrated with reference to FIG. 14 may be performed to form a first preliminary gate oxide layer (not shown). Here, the method of this example embodiment may not include a rinsing process.

A thermal oxidation process and a moisture absorption process may be performed to form a gate oxide layer 158a. In some example embodiments, the moisture absorption process may include exposing the preliminary gate oxide layer for about 1 hour to about 10 hours.

Processes substantially the same as those illustrated with reference to FIGS. 15 to 18 may be performed to complete the recessed channel transistor in FIG. 13.

Methods of manufacturing a recessed channel transistor in FIG. 19 in accordance with some example embodiments may be illustrated.

Processes substantially the same as those illustrated with reference to FIG. 20 may be performed to form an isolation layer pattern 152. A recess 156 may be formed at a first region of the semiconductor substrate. A plasma oxidation process may be performed to form a preliminary gate oxide layer (not shown). Here, the method of this example embodiment may not include a rinsing process.

A thermal oxidation process and a moisture absorption process may be performed to form a gate oxide layer 158a. In some example embodiments, the moisture absorption process may include exposing the preliminary gate oxide layer for about 1 hour to about 10 hours.

Processes substantially the same as those illustrated with reference to FIGS. 21 and 22 may be performed to complete the recessed channel transistor in FIG. 19.

Methods of manufacturing a recessed channel transistor in FIG. 26 in accordance with some example embodiments may be illustrated.

Processes substantially the same as those illustrated with reference to FIG. 27 may be performed to form an isolation layer pattern 152. A recess 156 may be formed at a first region of the semiconductor substrate. A plasma oxidation process may be performed to form a first preliminary gate oxide layer (not shown) and a second preliminary gate oxide layer (not shown). Here, the methods of such embodiments may not include a rinsing process.

A thermal oxidation process and a moisture absorption process may be performed to form a first gate oxide layer 158a and a second gate oxide layer 180. In some example embodiments, the moisture absorption process may include exposing the first preliminary gate oxide layer and, the second preliminary gate oxide layer for about 1 hour to about 10 hours. The first gate oxide layer 158a and the second gate oxide layer 180 may have substantially the same thickness.

Processes substantially the same as those illustrated with reference to FIG. 22 may be performed to complete the recessed channel transistor in FIG. 26.

Figure 34:
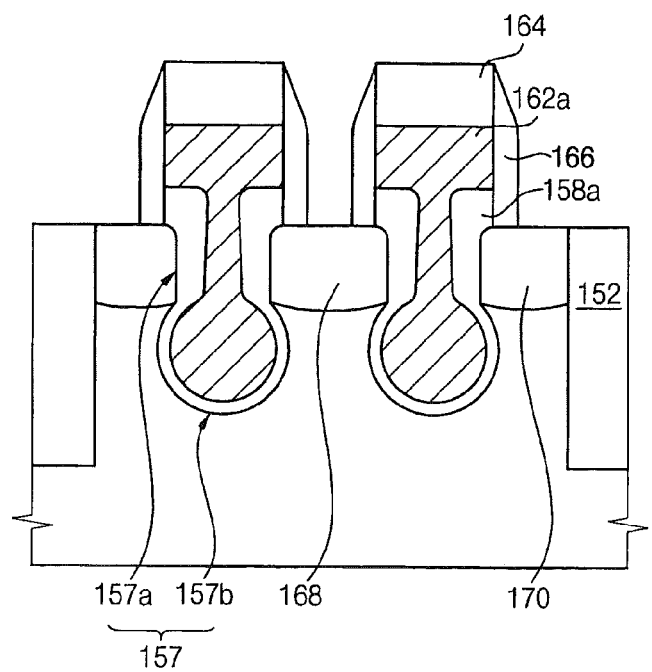
FIG. 34 is a cross-sectional view illustrating a recessed channel transistor in accordance with some embodiments of the present invention.

FIG. 34 is a cross-sectional view illustrating a recessed channel array transistor in accordance with some embodiments of the present invention. The recessed channel array transistor of such embodiments may include elements substantially the same as those of the recessed channel array transistor in FIG. 4 except for a recess. Thus, the same reference numerals refer to the same elements and any further illustrations with respect to the same element are omitted herein for brevity.

Referring to FIG. 34, a semiconductor substrate 150 may be prepared. In some example embodiments, the semiconductor substrate 150 may include single crystalline silicon. An isolation layer pattern 152 may be formed in the semiconductor substrate 150. The isolation layer pattern 152, may define an active region 150a and an isolation region of the semiconductor substrate 150. The active region 150a may have an isolated island shape. The isolation layer pattern 152 may be configured to surround the active region 150a.

A recess 157 may be formed at an upper surface of the semiconductor substrate 150 in the active region 150a. In some embodiments, the recess 157 may have a shape crossing over the active region 150a. Thus, the recess 157 may have a first side surface, a second side surface, a third side surface and a fourth side surface. The first side surface may confront the second side surface. The third side surface may confront the fourth side surface. Therefore, the first side surface and the second side surface may be substantially perpendicular to the third side surface and the fourth side surface. The semiconductor substrate 150 may be exposed through the first side surface and the second side surface. Further, the isolation layer pattern 152 may be exposed through the third side surface and the fourth side surface.

The recess 157 may have an upper portion 157a and a lower portion 157b in fluidic communication with the upper portion 157a. The upper portion 157a may have a first width. The lower portion 157b may have a second width greater than the first width. The second portion 157b may have a semi-spherical shape.

An intersection between a side edge of the recess 157 and a sidewall of the active region 150a may have a rounded shape without a sharp end and/or a smooth sharp end. An intersection between an upper end of the recess 157 and an upper surface of the semiconductor substrate 150 may have a rounded shape.

A gate oxide layer 158a may be formed on the upper surface of the semiconductor substrate 150 and the side surface of the recess 157. In some embodiments, the gate oxide layer 158a may have a gradually decreased thickness from the upper portion 157a to the lower portion 157b. That is, an upper portion of the gate oxide layer 158a in the upper portion 157a of the recess 157 may have a thickness greater than that of a lower portion of the gate oxide layer 158a in the lower portion 157b of the recess 157. The lower portion of the gate oxide layer 158a in the lower portion 157b of the recess 157 may have a uniform thickness. A portion of the gate oxide layer 158a on the intersection between the side edge of the recess 157 and the sidewall of the active region 150a may have a thickness greater than about 70% of a thickness of a portion of the gate oxide layer 158 on the side surface of the recess 157.

In some example embodiments, the gate oxide layer 158a may be formed by a plasma oxidation process and a rinsing process using $H_2O$. Alternatively, the gate oxide layer 158a may be formed by a plasma oxidation process, a thermal oxidation process and a moisture absorption process.

A gate electrode 162a may be formed on the gate oxide layer 158 to fill up the recess 157. A spacer 166 may be formed on a sidewall of the gate electrode 162a. Source/drain regions 168 and 170 may be formed in the semiconductor substrate 150 at both sides of the gate electrode 162a.

Figure 35:
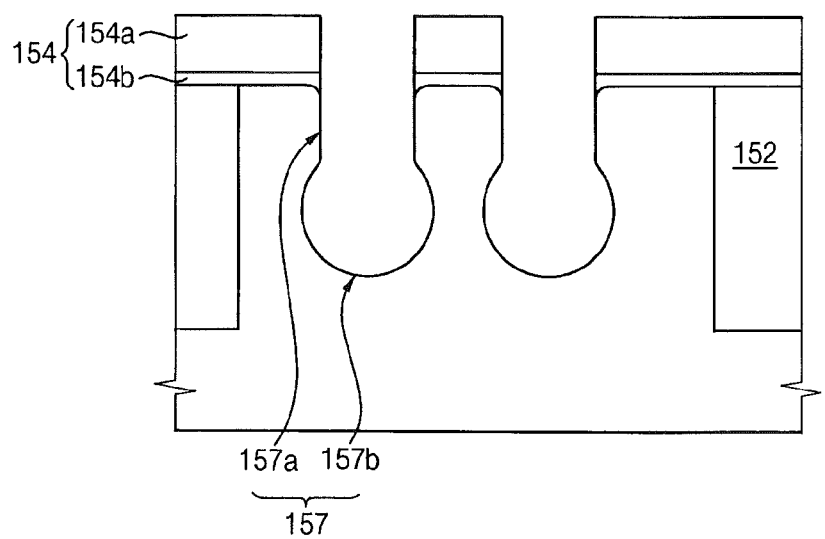
FIG. 35 is a cross-sectional view illustrating a method of forming the recessed channel transistor in FIG. 34.

FIG. 35 is a cross-sectional view illustrating methods of forming the recessed channel array transistor in FIG. 34.

Referring to FIG. 35, a shallow trench isolation process may be performed on a semiconductor substrate 150 to form an isolation layer pattern 152 configured to define an active region and an isolation region of the semiconductor substrate 150. In some embodiments, the active region may have an isolated island shape. The isolation layer pattern 152 may be configured to surround the active region.

A mask pattern 154 may be formed on the active region of the semiconductor substrate 150 and the isolation layer pattern 152 to expose a region of the semiconductor substrate 150 where a recess may be formed. In some embodiments, the mask pattern 154 may include a pad oxide layer pattern 154a and a silicon nitride layer pattern 154b formed on the pad oxide layer pattern 154a. The region of the semiconductor substrate 150 exposed through the mask pattern 154 may have a linear shape crossing over the active region.

The active region of the semiconductor substrate 150 may be anisotropically etched using the mask pattern 154 as an etch mask to form an upper recess 157a. In some embodiments, the upper recess 157a may be formed by a reactive ion etching process using an etching gas including chlorine. A cleaning process may be additionally performed to remove byproducts generated in the reactive ion etching process.

A protecting layer (not shown) may be formed on an inner surface of the upper recess 157a and mask pattern 154. In some embodiments, the protecting layer may include a material having an etching selectivity with respect to the semiconductor substrate 150. Examples of the protecting layer may include silicon oxide, and/or silicon nitride, among others. The protecting layer may be etched-back to form a protecting layer pattern (not shown) configured to cover the side surface of the upper recess 157a.

The semiconductor substrate 150 exposed through the upper recess 157a may be etched using the protecting layer pattern as an etch mask to form a lower recess 157b in fluidic communication with the upper recess 157a. In some embodiments, the lower recess 157b may be formed by an isotropic etching process. For example, the isotropic etching process may use an etching gas including $SF_6$, $Cl_2$ and/or $O_2$, among others.

The lower recess 157b may have a second width greater than a first width of the upper recess 157a. The lower recess 157b may have a semi-spherical shape.

The isolation layer pattern 152 may be exposed through the third surface and the fourth surface of the recess 157.

The mask pattern 154 may then be removed. Processes substantially the same as those illustrated with reference to FIGS. 7 to 12 may be performed to complete the recessed channel array transistor in FIG. 34. Alternatively, processes substantially the same as those illustrated with reference to FIG. 31 may be performed to complete the recessed channel transistor in FIG. 34.

Figure 36:
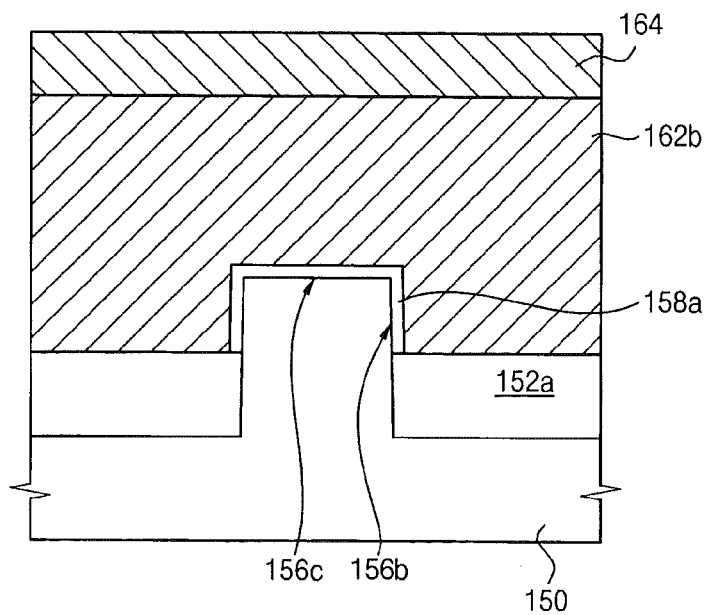
FIG. 36 is a cross-sectional view illustrating a recessed channel transistor in accordance with some embodiments of the present invention.
Figure 37:
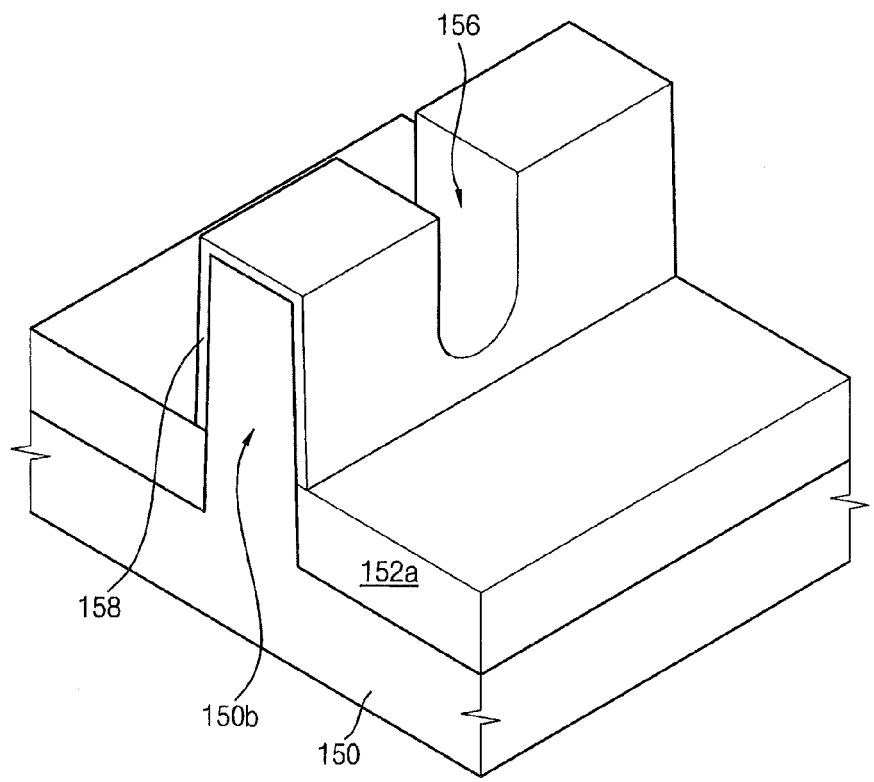
FIG. 37 is a perspective view illustrating an active pin and a gate oxide layer of the recessed channel transistor in FIG. 36.

FIG. 36 is a cross-sectional view illustrating a recessed channel array transistor in accordance with some embodiments of the present invention. FIG. 37 is a perspective view illustrating an active pin and a gate insulating layer in the recessed channel transistor in FIG. 36.

Here, the recessed channel array transistor of such embodiments may include a saddle-FinFET having a channel at an upper surface and a sidewall of an active region.

Further, the recessed channel array transistor of some embodiments may have a cross section in an extending direction of the active region substantially the same as that of the recessed channel array transistor in FIG. 4. In contrast, the recessed channel array transistor of some embodiments may have a cross section in an extending direction of a gate electrode different from that of the recessed channel array transistor in FIG. 4. Thus, any further illustrations with respect to the same cross section are omitted herein for brevity.

Referring to FIGS. 36 and 37, an active fin 150b and an isolation layer pattern 152a may be formed in the semiconductor substrate 150 including single crystalline silicon. A recess 156 may be formed in the active fin 150b.

In some embodiments, the isolation layer pattern 152a may have an upper surface lower than a bottom surface 156c of the recess 156. Some embodiments provide that the upper surface of the isolation layer pattern 152a may be even. In this case, the entire upper surface of the isolation layer pattern 152a may be lower than the bottom surface 156c of the recess 156.

In some embodiments, although not depicted in drawings, the upper surface of the isolation layer pattern 152a may have a high stepped portion and a low stepped portion. Particularly, a portion of the isolation layer pattern 152a adjacent the recess 156 may have the low stepped portion. In contrast, the rest portion of the isolation layer pattern 152a may have the high stepped portion. In this case, an upper surface of the portion of the isolation layer pattern 152a adjacent the recess 156 may be lower than the bottom surface 156c of the recess 156. Thus, a sidewall of the active fin 150b may be exposed between the bottom surface 156c of the recess 156 and the upper surface of the isolation layer pattern 152a. The rest portion of the isolation layer pattern 152a may have an upper surface higher than the bottom surface 156c of the recess 156. Further, the rest portion of the isolation layer pattern 152a may have a lower surface lower than the bottom surface 156c of the recess 156. Therefore, an outer wall 156b of the active fin 150b may be partially protruded from the isolation layer pattern 152a.

A gate oxide layer 158a may be formed on the upper surface of the semiconductor substrate 150 and the inner surface of the recess 156. In some example embodiments, the gate oxide layer 158a may be formed by a plasma oxidation process and a rinsing process using $H_2O$. Alternatively, the gate oxide layer 158a may be formed by a plasma oxidation process, a thermal oxidation process and a moisture absorption process.

A gate electrode 162b may be formed on the gate oxide layer 158a to fill up the recess 156. The gate electrode 162b may be partially protruded from the upper surface of the semiconductor substrate 150. Although not depicted in drawings, the gate electrode 162b may have a linear shape crossing over the active fin 150b.

A hard mask, a spacer and/or source/drain regions of the recessed channel array transistor in accordance with some embodiments may be substantially the same as those of the recessed channel array transistor in FIG. 4, respectively.

According to some embodiments, the recessed channel array transistor may include the saddle-FinFET, so that the recessed channel array transistor may have a long effective channel length. As a result, the recessed channel array transistor may have a low off-current.

Figure 38:
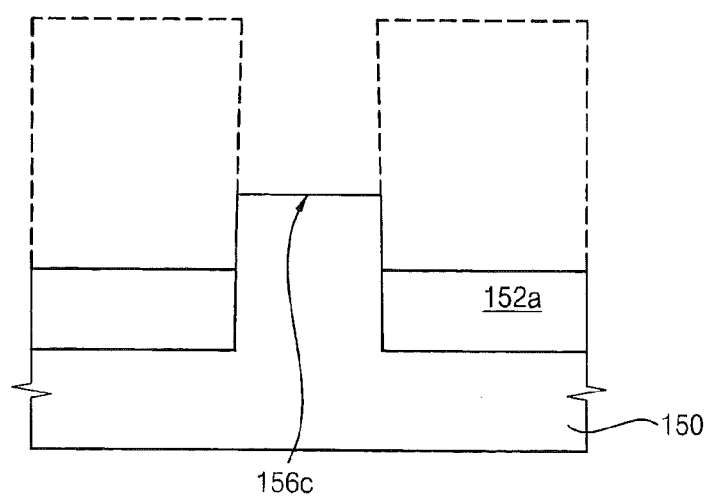
FIG. 38 is a cross-sectional view illustrating a method of forming the recessed channel transistor in FIG. 36.

FIG. 38 is a cross-sectional view illustrating methods of forming the recessed channel array transistor in FIG. 36.

Here, the methods of some embodiments may include processes substantially the same as those for forming the recessed channel array transistor in FIG. 4 except for including an addition process for removing an isolation layer pattern after forming a recess. Thus, any further illustrations with respect to the same processes are omitted herein for brevity.

Processes substantially the same as those described above and illustrated with reference to FIG. 7 may be performed to a preliminary isolation layer pattern and a recess.

Referring to FIGS. 37 and 38, the preliminary isolation layer pattern may be partially etched to form an isolation layer pattern 152a having an upper surface lower than the recess.

In some embodiments, the entire upper surface of the preliminary isolation layer pattern may be etched to form the isolation layer pattern 152a having a flat upper surface. Some embodiments provide that a portion of the preliminary isolation layer pattern adjacent the recess may be selectively etched to form the isolation layer pattern 152a having a stepped portion. The stepped portion of the isolation layer pattern 152a may have an upper surface lower than the recess.

Processes substantially the same as those described above and illustrated with reference to FIGS. 8 to 12 may be performed to complete the recessed channel array transistor in FIG. 36.

Figure 39:
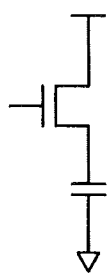
FIG. 39 is a circuit diagram illustrating a DRAM device in accordance with some embodiments of the present invention.

FIG. 39 is a circuit diagram illustrating a DRAM device in accordance with some embodiments of the present invention. A DRAM device of some embodiments may include a MOS transistor and a capacitor. The MOS transistor may include the recessed channel array transistor of some embodiments. Further, although not depicted in, drawings, the MOS transistor in a peripheral circuit of the DRAM device may include the planar transistor of some embodiments as described herein.

Figure 40:
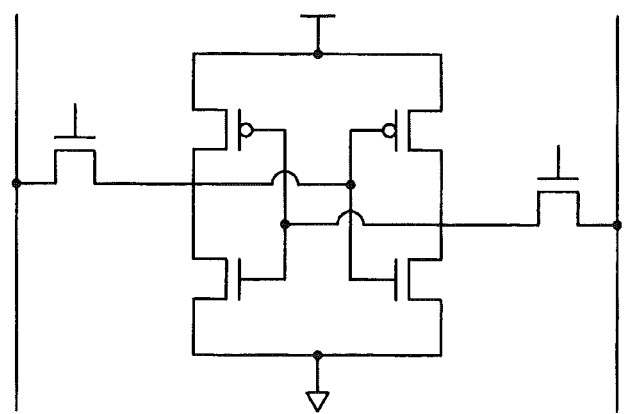
FIG. 40 is a circuit diagram illustrating an SRAM device in accordance with some embodiments of the present invention.

FIG. 40 is a circuit diagram illustrating an SRAM device in accordance with some embodiments of the present invention. An SRAM device of some embodiments may include an NMOS transistor and a PMOS transistor. The NMOS transistor and the PMOS transistor may include the recessed channel array transistor of some embodiments as described herein.

Figure 41:
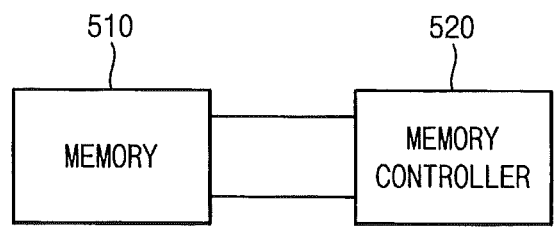
FIG. 41 is a block diagram illustrating a memory system in accordance with some embodiments of the present invention.

FIG. 41 is a block diagram illustrating a memory system in accordance with some embodiments of the present invention. A memory system of some embodiments may include a memory controller 520 and a memory 510. The memory 510 may include the recessed channel array transistor of some embodiments as described herein. The planar transistor of some embodiments may be formed in a peripheral region of the memory 510.

The memory controller 520 may input a signal into the memory 510 to control operations of the memory 510. In some embodiments, the signal may include a command signal, an address signal, and/or an input/output signal, among others. The memory controller 520 may control data in the DRAM device in accordance with the signal.

Figure 42:
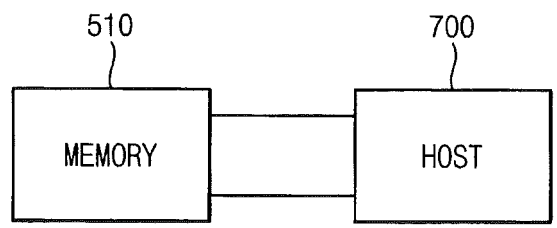
FIG. 42 is a block diagram illustrating a host system in accordance with some embodiments of the present invention.

FIG. 42 is a block diagram illustrating a host system in accordance with some embodiments of the present invention. Some embodiments provide that a host system 700 of some embodiments may be connected to a memory 510. The memory 510 may include the recessed channel array transistor of some embodiments as described herein. The planar transistor may be formed in a peripheral region of the memory 510.

In some embodiments, the host system 700 may include an electronic device such as a personal computer, a camera, a mobile device, a game device, and/or a communication device, among others. The host system 700 may apply a signal, which may be used for control and operate the memory 510, to the memory 510.

Figure 43:
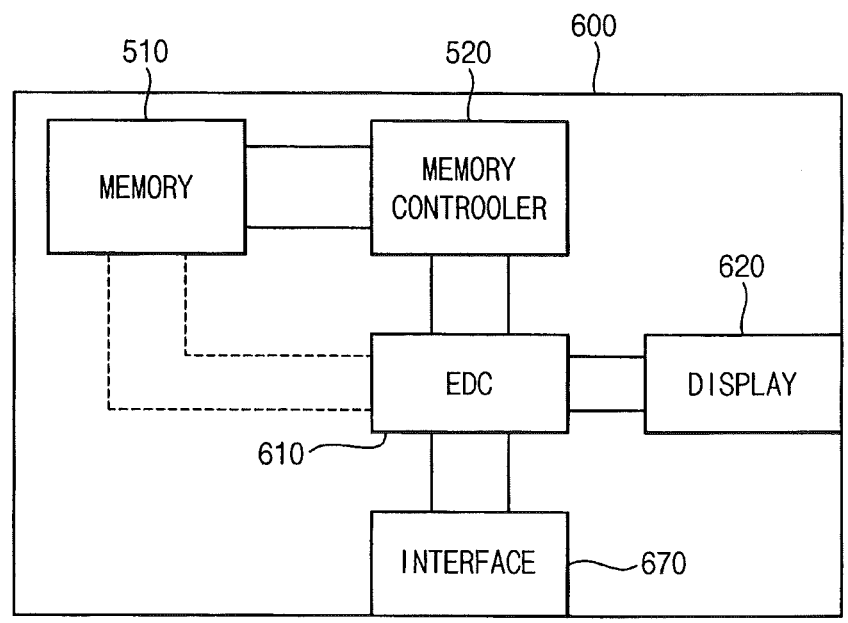
FIG. 43 is a block diagram illustrating a portable device in accordance with some embodiments of the present invention.

FIG. 43 is a block diagram illustrating a portable device in accordance with some embodiments of the present invention. Some embodiments provide that a portable device 600 may include an MP3 player, and/or a video player, among others. The portable device 600 may include a memory 510 and/or a memory controller 520. The memory 510 may include the recessed channel array transistor of some embodiments as described herein. The planar transistor of some embodiments may be formed in a peripheral region of the memory 510.

In some embodiments, the portable device 600 may also include an encoder/decoder 610, a display 620 and an interface 670. Data may be input/output into/from the memory 510 through the memory controller 520 by the encoder/decoder 620.

Figure 44:
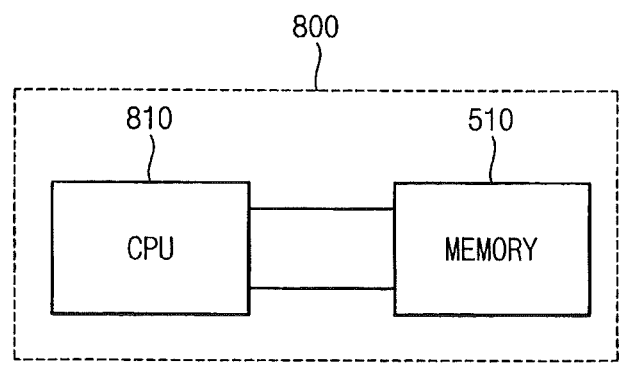
FIG. 44 is a block diagram illustrating a computer system in accordance with some embodiments of the present invention.

FIG. 44 is a block diagram illustrating a computer system in accordance with some embodiments of the present invention. Some embodiments provide that the memory 510 may be connected with a central processing unit (CPU) 810 of a computer system 800. In some embodiments, the computer system 800 may include a personal computer, and/or a personal data assistant device, among others. The memory 510 may be connected to the CPU 810 directly and/or indirectly via a bus. The memory 510 may include the recessed channel array transistor of some embodiments as described herein. The planar transistor may be formed in the peripheral region of the memory 510. Although not depicted in drawings, other elements may be constituted in the computer system 800.

Here, the recessed channel array transistors of these exemplary embodiments may have a three-dimensional structure. For example, the gate oxide layer may be used in a recessed channel array transistor, a saddle transistor, a saddle fin transistor, and/or a recessed fin transistor, among others.

COMPARATIVE EXPERIMENT 1

Manufacturing a Comparative Sample 1

A recess was formed at an upper surface of a semiconductor substrate. An oxide layer was formed on an inner surface of the recess by a plasma oxidation process. The recess had a shape substantially the same as that of the recess in FIG. 1. The recess had a depth of about 1,600 Å and an upper diameter of about 800 Å.

Manufacturing Samples 1 to 5

Recesses were formed at upper surfaces of five semiconductor substrates, respectively. Preliminary oxide layers were formed on inner surfaces of the recesses by a plasma oxidation process. A thermal oxidation process was performed on the preliminary oxide layers to form oxide layers. Increased thicknesses of Samples 1 to 5 formed by the thermal oxidation process were about 20 Å, about 25 Å, about 30 Å, about 35 Å and about 40 Å. The recesses had a shape substantially the same as that of the recess in FIG. 1. Each of the recesses had a depth of about 1,600 Å and an upper diameter of about 800 Å. A moisture absorption process was not performed on Samples 1 to 5.

Measuring Thicknesses of Oxide Layers

Thicknesses of the oxide layers on the inner surfaces of the recesses in the samples 1 to 5 and comparative sample 1, respectively, were measured. Particularly, thicknesses of first oxide layers in the upper recess were measured. Thicknesses of second oxide layers in the lower recess were measured. The thicknesses of the oxide layers in the upper recess were measured at a portion of the upper recess adjacent a boundary between the upper recess and the lower recess. Measured thicknesses are illustrated in the following Table 1.

TABLE 1

| | Thickness of first oxide layer (Å) | Thickness of second oxide layer (Å) | Increased thickness by thermal oxidation process (Å) |
|---|---|---|---|
| Comparative sample 1 | 104 | 43 | |
| Sample 1 | 104 | 45 | 20 |
| Sample 2 | 104 | 47 | 25 |
| Sample 3 | 105 | 48 | 30 |
| Sample 4 | 105 | 56 | 35 |
| Sample 5 | 105 | 59 | 40 |

In Table 1, the first oxide, layers in the samples 1 to 5 and comparative sample 1 have substantially the same thickness. Thus, it can be noted that the first oxide layers do not have a thickness change in accordance with the conditions of the thermal oxidation process.

Further, it can be noted that the second oxide layers have increased thicknesses in proportion to the increased thickness by the thermal oxidation process.

Thus, when the thermal oxidation process may be performed after the plasma oxidation process, the thickness of the first oxide layer on the upper recess and the semiconductor substrate may not be changed. In contrast, the thickness of the second oxide layer on the bottom surface of the recess is increased. Therefore, it can be noted that the thermal oxidation process may prevent generation of a leakage current, which may be caused by a small thickness of the oxide layer on the bottom surface of the recess, and also densify the structure of the oxide layer.

Measuring a Thickness of an Oxide Layer in Accordance with Standby Times

A plasma oxidation process was performed on semiconductor substrates to form preliminary oxide layers. A thermal oxidation process was performed on the preliminary oxide layers to form oxide layers. After the oxide layers were on standby, thicknesses of the oxide layers were measured.

Figure 45:
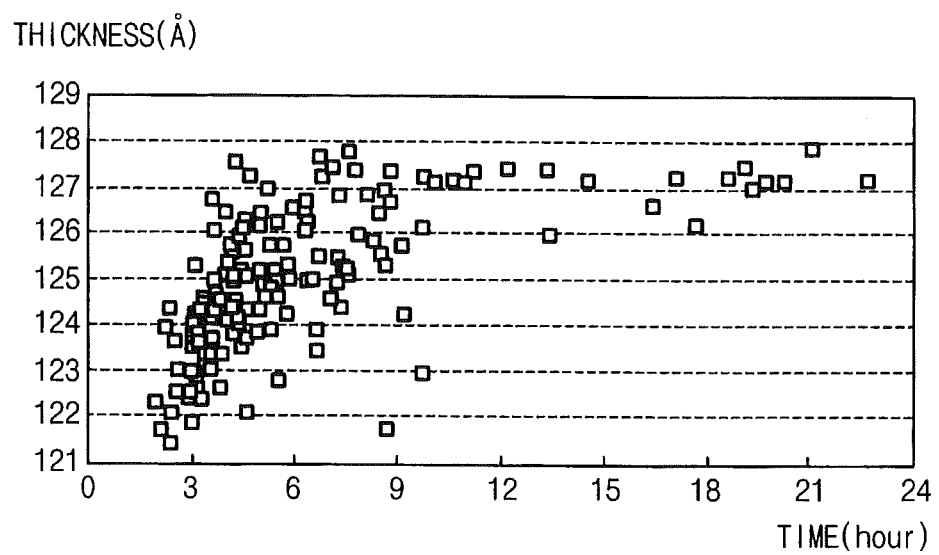
FIG. 45 is a graph showing thickness changes of a gate oxide layer in accordance with times.

FIG. 45 is a graph showing thicknesses of oxide layers in accordance with standby times.

Referring to FIG. 45, it can be noted that the thicknesses of the oxide layers are gradually increased in proportion to the standby time. However, after the standby time of about 10 hours, the thicknesses of the oxide layers are not increased any more. Thus, it can be noted that the thicknesses of the oxide layers are increased in proportion to the standby time, although the structure of the oxide layer may be densified by the thermal oxidation process. The thickness increase of the oxide layer is caused by bonding between the dangling bonds and hydrogen.

As shown, the oxide layer has a thickness distribution in accordance with the standby time. Thus, the oxide layer having desired characteristics may be formed by exposing the preliminary oxide layer.

COMPARATIVE EXPERIMENT 2

Manufacturing a Comparative Sample

A plasma oxidation process was performed on a semiconductor substrate to form a preliminary oxide layer. A thermal, oxidation process was performed on the preliminary oxide layer to form an oxide layer. A thickness of the oxide layer was measured. The oxide layer was etched using HF. A thickness of the etched oxide layer was measured. Measured thicknesses are illustrated in the following Table 2.

TABLE 2

|  | Thickness of oxide layer (Å) |
|---|---|
| After thermal oxidation process | 128.9 |
| After etching process | 125.2 |

Manufacturing a Comparative Sample

A plasma oxidation process was performed on a semiconductor substrate to form a preliminary oxide layer. A thermal oxidation process was performed on the preliminary oxide layer to form an oxide layer. The oxide layer was rinsed using H$_2$O. A thickness of the rinsed oxide layer was measured. The oxide layer was etched using HF. A thickness of the etched oxide layer was measured. Measured thicknesses are illustrated in the following Table 3.

TABLE 3

|  | Thickness of oxide layer (Å) |
|---|---|
| After thermal oxidation process | 128.9 |
| After rinsing process | 129.4 |
| After etching process | 127.2 |

As shown in Table 3, the thickness of the oxide layer after the thermal oxidation process is about 128.9 Å. The thickness of the oxide layer after the rinsing process is 129.4 Å. Thus, it can be noted that the thickness of the oxide layer after the rinsing process is increased. That is, the thickness of the rinsed oxide layer is substantially the same as that of the oxide layer that is on standby for no less than about 5 hours. As a result, it can be noted that the rinsing process may increase the thickness of the oxide layer without increasing the standby time. Further, it can be noted that the thickness of the rinsed oxide layer is not increased in proportional to the standby time.

Further, as shown in Table 2, the etched thickness of the oxide layer without the rinsing process is about 3.7 Å. In contrast, as shown in Table 3, the etched thickness of the oxide layer with the rinsing process is about 2.1 Å. It can be noted that the rinsing process may reduce the etched thickness of the oxide layer as well as the thickness of the oxide layer. Therefore, it can be noted that the rinsed oxide layer has a uniform thickness distribution.

According to some embodiments, the oxide layer may have a uniform thickness distribution and a dense structure. Thus, the oxide layer may be used for gate insulating layers of various transistors. Particularly, the oxide layer may be used for a gate insulating layer of a recessed channel transistor.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method of forming a recessed channel array transistor, the method comprising:
   forming a recess in a substrate at an active region of the substrate using a mask pattern on the substrate;
   forming, after removing the mask pattern from the substrate, a preliminary gate oxide layer on an inner surface of the recess and an upper surface of the substrate by a plasma oxidation process;
   absorbing moisture in the preliminary gate oxide layer to form a gate oxide layer, the moisture including H$_2$O or both an oxygen gas and a hydrogen gas;
   forming a gate electrode on the gate oxide layer to fill up the recess; and
   forming source/drain regions in the upper surface of the substrate at both sides of the gate electrode.

2. The method of claim 1, wherein absorbing the moisture in the preliminary gate oxide layer comprises rinsing the preliminary gate oxide layer using H$_2$O.

3. The method of claim 2, wherein the preliminary gate oxide layer is rinsed at a room temperature to about 90° C. for a rinsing time interval, and wherein the rinsing time interval is in a range from a plurality of seconds to a plurality of minutes.

4. The method of claim 1, wherein absorbing the moisture in the preliminary gate oxide layer comprises exposing the preliminary gate oxide layer to atmosphere for an exposure time interval, and wherein the exposure time interval is in a range from about 1 hour to about 10 hours.

5. The method of claim 1, wherein the plasma oxidation process is performed at a temperature in a range from about room temperature to about 900° C.

6. The method of claim 1, further comprising thermally oxidizing the preliminary gate oxide layer.

7. The method of claim 6, wherein thermally oxidizing the preliminary gate oxide layer comprises increasing a thickness of the preliminary gate oxide layer on a bottom surface of the recess.

8. The method of claim 6, wherein the thermal oxidation process is performed at a temperature of about 800° C. to about 1,100° C.

9. The method of claim 6, wherein thermally oxidizing the preliminary gate oxide layer comprises:
   gradually increasing a temperature in a chamber to an oxidation temperature;
   introducing an oxygen gas and a hydrogen gas into the chamber at the oxidation temperature to thermally oxidize the preliminary gate oxide layer; and
   gradually decreasing the temperature in the chamber.

10. The method of claim 9, wherein absorbing the moisture comprises decreasing the temperature in the chamber comprises introducing H$_2$O or an oxygen gas and a hydrogen gas into the chamber.

11. The method of claim 10, wherein absorbing the moisture is performed while the temperature is gradually decreased and/or maintained.

12. The method of claim 10, wherein absorbing the moisture is performed at a temperature of about 100° C. to about 500° C. for a time interval including a range from a plurality of seconds to a plurality of minutes.

13. The method of claim 1, wherein the gate oxide layer includes a gradually decreased thickness from the side upper surface of the recess to the side lower surface of the recess.

14. The method of claim 13, wherein forming the preliminary gate oxide layer on the inner surface of the recess and the upper surface of the substrate by the plasma oxidation process comprises controlling an influx of an oxidizing agent by a depth of the recess to change a thickness of the gate oxide layer.

15. The method of claim 1, wherein absorbing the moisture in the preliminary gate oxide layer comprises bonding dangling bonds at a surface of the preliminary gate oxide layer with oxygen to increase a thickness of the preliminary gate oxide layer.

16. A method of forming a semiconductor device, the method comprising:
   etching an active region in a substrate to form a recess in the substrate using a hard mask to define the recess;
   performing, after removing the hard mask, a plasma oxidation process on an upper surface of the substrate to form a first preliminary gate oxide layer;
   thermally oxidizing the preliminary gate oxide layer;
   absorbing moisture in the preliminary gate oxide layer to form a gate oxide layer by bonding dangling bonds at a surface of the preliminary gate oxide, the moisture including $H_2O$ or both an oxygen gas and a hydrogen gas;
   filling the recess to form a gate electrode on the gate oxide layer; and
   implanting impurities in the substrate at both sides of the gate electrode to form source/drain regions.

17. The method according to claim 16, wherein absorbing the moisture in the preliminary oxide layer comprises rinsing the preliminary gate oxide layer using $H_2O$ at a room temperature to about 90° C. for a rinsing time interval, and wherein the rinsing time interval is in a range from a plurality of seconds to a plurality of minutes.

18. The method according to claim 16, wherein absorbing the moisture in the preliminary gate oxide layer comprises exposing the preliminary gate oxide layer to atmosphere for an exposure time interval, and wherein the exposure time interval is in a range from about 1 hour to about 10 hours.

19. The method according to claim 16, wherein thermally oxidizing the preliminary gate oxide layer is performed at a temperature of about 800° C. to about 1,100° C. and comprises:
   gradually increasing a temperature in a chamber to an oxidation temperature;
   introducing an oxygen gas and a hydrogen gas into the chamber at the oxidation temperature to thermally oxidize the preliminary gate oxide layer; and
   gradually decreasing the temperature in the chamber.

20. The method according to claim 19, wherein absorbing the moisture comprises decreasing the temperature in the chamber comprises introducing $H_2O$ or an oxygen gas and a hydrogen gas into the chamber and is performed while the temperature is gradually decreased and/or maintained.

* * * * *